(12) United States Patent
Ahn et al.

(10) Patent No.: US 12,727,367 B2
(45) Date of Patent: Sep. 1, 2026

(54) DISPLAY DEVICE INCLUDING A FIRST SEPARATOR AND A SECOND SEPARATOR

(71) Applicant: Samsung Display Co., Ltd., Yongin-si (KR)

(72) Inventors: Donggi Ahn, Yongin-si (KR); Jongwoo Park, Yongin-si (KR); Soonwook Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 448 days.

(21) Appl. No.: 18/322,414

(22) Filed: May 23, 2023

(65) Prior Publication Data

US 2024/0016039 A1 Jan. 11, 2024

(30) Foreign Application Priority Data

Jul. 11, 2022 (KR) ........................ 10-2022-0085275

(51) Int. Cl.
*H10K 59/80* (2023.01)
*G09G 3/3233* (2016.01)

(52) U.S. Cl.
CPC ......... *H10K 59/873* (2023.02); *G09G 3/3233* (2013.01); *G09G 2300/0842* (2013.01)

(58) Field of Classification Search
CPC ............... H10K 59/873; G09G 3/3233; G09G 2300/0842
USPC ............................................................ 257/40
See application file for complete search history.

(56) References Cited

U.S. PATENT DOCUMENTS

| | | | | |
|---|---|---|---|---|
| 8,188,649 | B2 | 5/2012 | Sung et al. | |
| 9,412,801 | B2 | 8/2016 | Choi | |
| 10,741,788 | B2 | 8/2020 | Won et al. | |
| 10,978,672 | B2 | 4/2021 | Lee et al. | |
| 2020/0110495 | A1 | 4/2020 | Han et al. | |
| 2020/0303478 | A1 | 9/2020 | Lee et al. | |
| 2021/0210725 | A1 | 7/2021 | Choi | |
| 2022/0077438 | A1 | 3/2022 | Wang et al. | |
| 2022/0093883 | A1* | 3/2022 | Jian | H10K 85/40 |

FOREIGN PATENT DOCUMENTS

| | | | | |
|---|---|---|---|---|
| CN | 111916481 | A * | 11/2020 | H10K 59/122 |
| CN | 113990897 | A * | 1/2022 | H10K 59/131 |
| JP | 2018124501 | A * | 8/2018 | G09G 3/3233 |
| KR | 10-0864882 | B1 | 10/2008 | |
| KR | 10-2020-0003336 | A | 1/2020 | |
| KR | 10-2020-0039903 | A | 4/2020 | |
| KR | 10-2020-0073544 | A | 6/2020 | |

(Continued)

*Primary Examiner* — Phuc T Dang
(74) *Attorney, Agent, or Firm* — Womble Bond Dickinson (US) LLP

(57) ABSTRACT

A display device includes: a substrate having an opening area, a display area at least partially extending around the opening area, and a middle area between the opening area and the display area; a light-emitting element in the display area, the light-emitting element including a pixel electrode, an opposite electrode, and a functional layer between the pixel electrode and the opposite electrode; a first separator in the middle area; a second separator between the first separator and the opening area; a first groove between the first separator and the second separator; and a first protective layer between the substrate and the first groove.

8 Claims, 28 Drawing Sheets

(56) References Cited

FOREIGN PATENT DOCUMENTS

| | | | |
|---|---|---|---|
| KR | 10-2020-0111889 | A | 10/2020 |
| KR | 10-2021-0052876 | A | 5/2021 |
| KR | 10-2021-0087610 | A | 7/2021 |
| KR | 10-2022-0037524 | A | 3/2022 |

* cited by examiner

530
G6
520
G5
630
G4
620
G3
610
G2
510
G1
300
310 320 330
3100P
3300P
1000P
OA
MA
III
III'
126
125
124
123
122
213a
211a
209a
121
113
112
111
230
223
222c
222a
222
213
211
209
207
205
203
201
105
100

DISPLAY DEVICE INCLUDING A FIRST SEPARATOR AND A SECOND SEPARATOR

CROSS-REFERENCE TO RELATED APPLICATION

This application claims priority to and the benefit of Korean Patent Application No. 10-2022-0085275, filed on Jul. 11, 2022, in the Korean Intellectual Property Office, the disclosure of which is incorporated by reference herein in its entirety.

BACKGROUND

1. Field

Aspects of embodiments of the present disclosure relate to a display device and a method of manufacturing the same.

2. Description of the Related Art

Recently, the usage of display devices has diversified. Also, as display devices have become thinner and more lightweight, the use thereof has expanded.

By increasing a proportion of the display device forming a display area, various functions have been connected or linked to the display devices. To further increase the proportion of the display area and to add various functions, studies have been conducted into a display device in which various elements are arranged in a display area.

SUMMARY

Embodiments of the present disclosure provide a display device having a first area that may be used for various purposes, such as arrangement of various types of components in a display area. However, this is merely an example, and the scope of the present disclosure is not limited thereto.

Additional aspects and features of the present disclosure will be set forth, in part, in the description that follows and, in part, will be apparent from the description or may be learned by practice of the presented embodiments.

According to an embodiment of the present disclosure, a display device includes: a substrate having an opening area, a display area at least partially extending around the opening area, and a middle area between the opening area and the display area; a light-emitting element in the display area, the light-emitting element including a pixel electrode, an opposite electrode, and a functional layer between the pixel electrode and the opposite electrode; a first separator in the middle area; a second separator between the first separator and the opening area; a first groove defined between the first separator and the second separator; and a first protective layer between the substrate and the first groove.

The first separator may include a first organic pattern layer, a second organic pattern layer, and a third organic pattern layer sequentially stacked in this order, and a width of an upper portion of the first organic pattern layer may be greater than a width of a lower portion of the first organic pattern layer.

A width of the second organic pattern layer may be greater than a width of the first organic pattern layer.

The functional layer may extend from the display area to the middle area, and the functional layer may be disconnected at the first separator and the second separator.

The opposite electrode may extend from the display area to the middle area, and the opposite electrode may be disconnected at the first separator and the second separator.

The display device may further include a first dam between the display area and the first separator, a second groove between the first dam and the first separator, and a second protective layer between the substrate and the second groove.

The display device may further include a third separator between the second separator and the opening area, a third groove between the second separator and the third separator, and a third protective layer between the substrate and the third groove.

The display device may further include a second dam between the third separator and the opening area and a crack dam between the second dam and the opening area.

According to an embodiment of the present disclosure, a method of manufacturing a display device includes: forming a planarization layer on a substrate, the substrate having an opening area, a display area at least partially extending around the opening area, and a middle area between the opening area and the display area; forming a second organic pattern layer on the planarization layer; forming a third organic pattern layer on the second organic pattern layer; forming a cover layer on the third organic pattern layer; forming a first organic pattern layer by patterning the planarization layer; and removing the cover layer.

The forming of the second organic pattern layer on the planarization layer may include forming a first organic material layer on the planarization layer and forming the second organic pattern layer by patterning the first organic material layer.

The forming of the third organic pattern layer on the second organic pattern layer may include forming a second organic material layer on the second organic pattern layer and forming the third organic pattern layer by patterning the second organic material layer.

The third organic pattern layer may cover the second organic pattern layer.

The cover layer may cover the third organic pattern layer.

An end of the cover layer may be on the planarization layer.

The first organic pattern layer may be formed by dry-etching at least a portion of the planarization layer. A groove may be formed by etching the first organic pattern layer.

A groove may be formed by the first organic pattern layer.

A width of an upper portion of the first organic pattern layer may be greater than a width of a lower portion of the first organic pattern layer, and a width of the second organic pattern layer may be greater than a width of the first organic pattern layer.

The method may further include forming a functional layer and an opposite electrode on the third organic pattern layer. The functional layer and the opposite electrode may be disconnected from each other at the first organic pattern layer.

The method may further include forming a thin-film encapsulation layer on the opposite electrode. The thin-film encapsulation layer may include at least one inorganic encapsulation layer and at least one organic encapsulation layer.

According to an embodiment of the present disclosure, a method of manufacturing a display device includes: forming a planarization layer on a substrate, the substrate having an opening area, a display area at least partially extending around the opening area, and a middle area between the opening area and the display area; forming second organic pattern layers on the planarization layer; forming third organic pattern layers on the second organic pattern layers, respectively; forming a cover layer on the third organic pattern layers; forming first organic pattern layers by patterning the planarization layer; and removing the cover layer.

A groove may be between the first organic pattern layers that are adjacent to each other.

BRIEF DESCRIPTION OF THE DRAWINGS

The above and other aspects and features of embodiments of the present disclosure will be more apparent from the following description, taken in conjunction with the accompanying drawings, in which.

DETAILED DESCRIPTION

Figure 1:
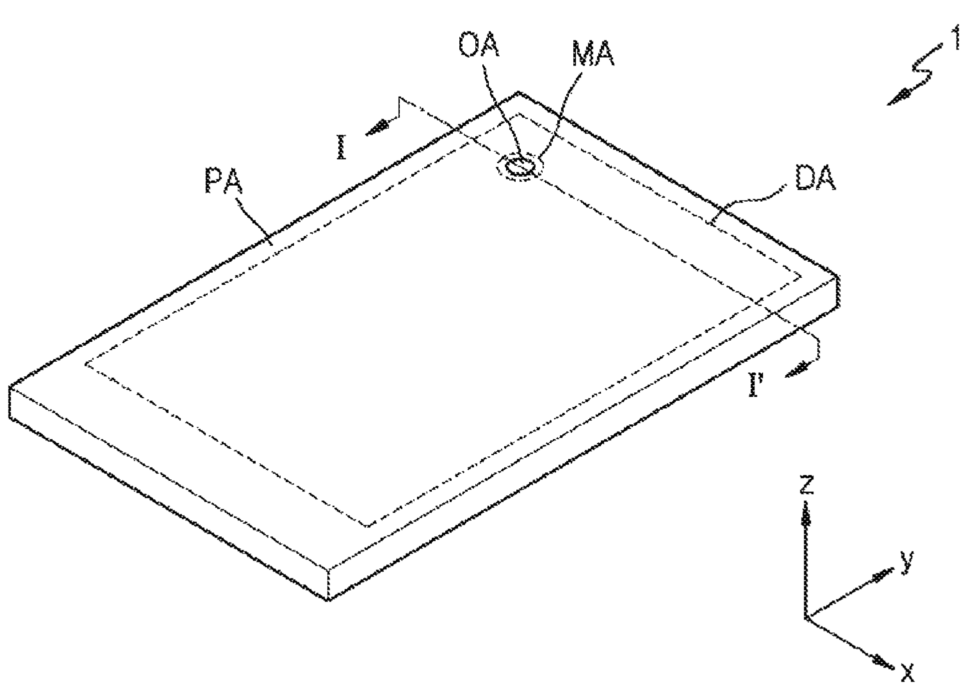
FIG. 1 is a perspective view schematically illustrating a display device according to an embodiment.

Reference will now be made in detail to embodiments, examples of which are illustrated in the accompanying drawings. The embodiments described herein may have different forms and should not be construed as being limited to the descriptions set forth herein. Accordingly, the embodiments are described below, by referring to the figures, to explain aspects and features of the present disclosure. Because the present disclosure allows for various changes and numerous embodiments, some embodiments will be illustrated in the drawings and described, in detail, in the written description. Aspects and features of the present disclosure, and methods of achieving the same, will be clarified with reference to embodiments described below in detail with reference to the drawings. However, the present disclosure is not limited to the following embodiments and may be embodied in various forms.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

When a certain embodiment may be implemented differently, a specific process order may be performed differently from the described order. For example, two consecutively described processes may be performed substantially at the same time (e.g., concurrently or simultaneously) or may be performed in an order opposite to the described order.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

Hereinafter, embodiments of the present disclosure will be described in detail with reference to the accompanying drawings.

FIG. 1 is a perspective view schematically illustrating a display device 1 according to an embodiment.

Figure 2A:
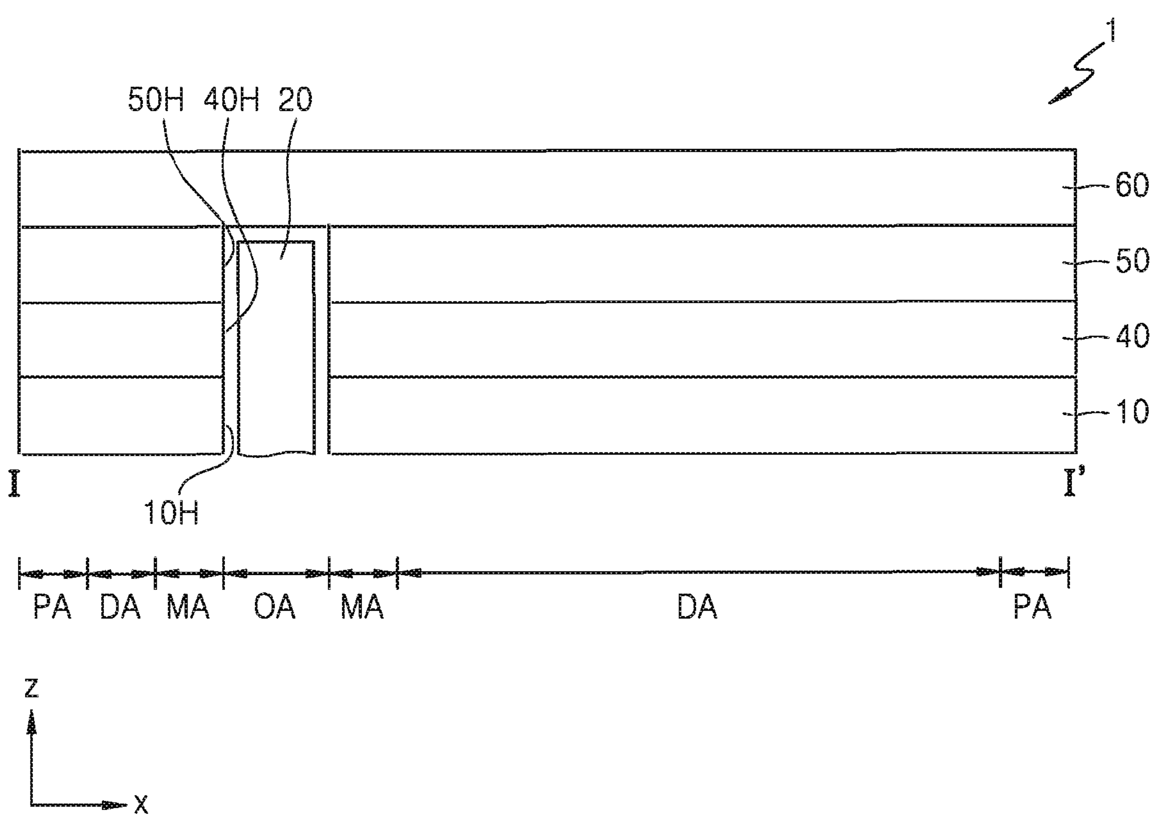
FIGS. 2A and 2B are cross-sectional views taken along the line I-I' in FIG. 1 showing embodiments.

Referring to FIG. 1, the display device 1 has an opening area OA and a display area DA at least partially surrounding (e.g., at least partially surrounding in a plan view or at least partially extending around a periphery of) the opening area OA. The display device 1 may provide (e.g., may display) an image by using light emitted from a plurality of pixels arranged in the display area DA. FIG. 1 illustrates that one opening area OA is arranged in the display area DA and that the opening area OA may be completely surrounded by the display area DA. The opening area OA may be an area in which a component, to be described below with reference to FIG. 2A, is arranged.

A middle area MA may be between the opening area OA and the display area DA, and the display area DA may be surrounded by a peripheral area PA. The middle area MA and the peripheral area PA may be non-display areas in which pixels are not arranged. The middle area MA may be completely surrounded by the display area DA, and the display area DA may be completely surrounded by the peripheral area PA.

Hereinafter, an organic light-emitting display will be described as an example of the display device 1 according to an embodiment, but the display device according to the present disclosure is not limited thereto. According to another embodiment, a display device, such as a quantum dot light-emitting display, may be used.

FIG. 1 illustrates one opening area OA having a substantially circular shape, but the present disclosure is not limited thereto. The display device 1 may have two or more opening areas OA. Further, the shape of each of the two or more opening areas OA may be variously modified. For example, the two or more opening areas OA may each have a circular shape, an oval shape, a polygonal shape, a star shape, or a diamond shape.

Figure 2B:
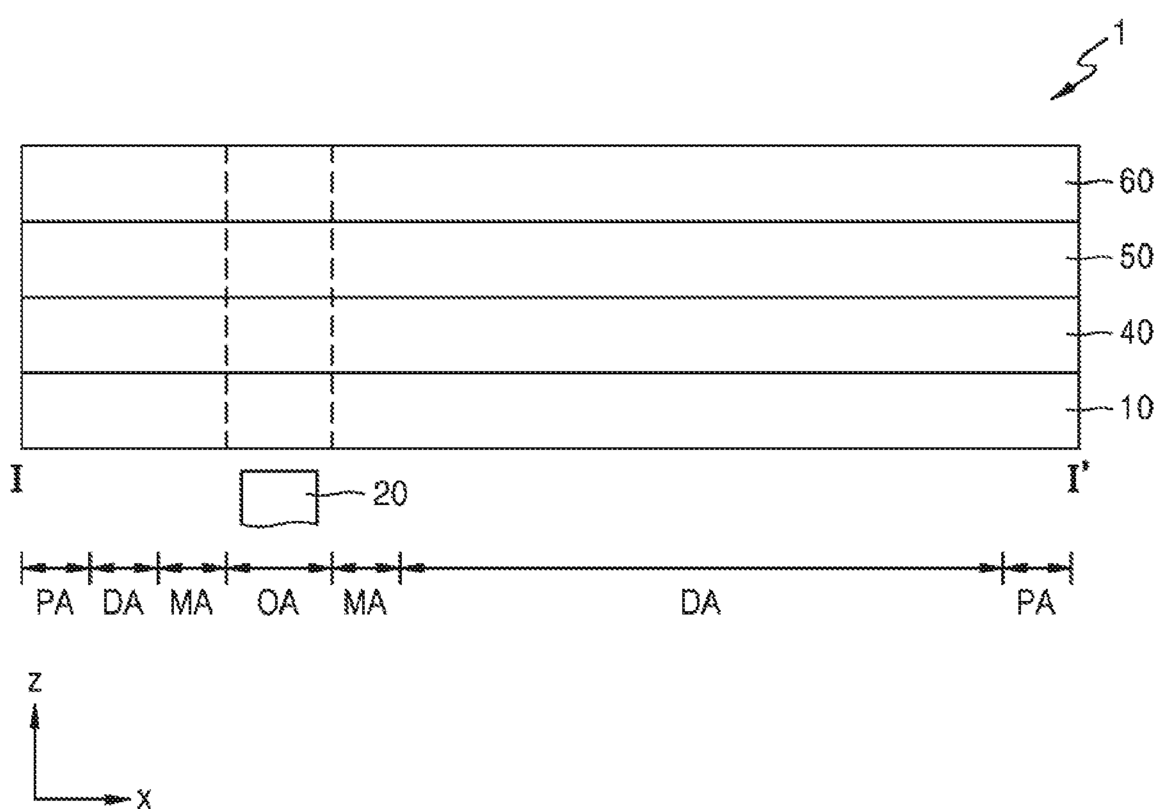

FIGS. 2A and 2B are cross-sectional views schematically illustrating the display device 1 according to an embodiment and correspond to a cross-section of the display device 1 taken along the line I-I' of FIG. 1.

Referring to FIG. 2A, the display device 1 may include a display panel 10, an input sensing layer 40 on the display panel 10, and an optical function layer 50. The display panel 10, the input sensing layer 40, and the optical function layer 50 may be covered by a window 60. The display device 1 may be various types of electronic devices, such as mobile phones, laptops, and smart watches.

The display panel 10 may be configured to display an image. The display panel 10 includes pixels arranged in the display area DA. The pixels may each include a display element and a pixel circuit connected thereto. The display element may include an organic light-emitting diode or a quantum dot organic light-emitting diode.

The input sensing layer 40 may be configured to obtain coordinate information according to an external input, for example, a touch event. The input sensing layer 40 may include a sensing electrode (or a touch electrode) and trace lines connected to the sensing electrode. The input sensing layer 40 may be disposed on the display panel 10. The input sensing layer 40 may be configured to sense an external input by using a mutual capacitance method and/or a self-capacitance method.

The input sensing layer 40 may be directly formed on the display panel 10 or may be formed separately and then bonded to the display panel 10 through an adhesive layer, such as an optical clear adhesive. For example, the input sensing layer 40 may be formed continuously after the process of forming the display panel 10. In such an embodiment, the input sensing layer 40 may be understood as being a portion of the display panel 10, and an adhesive layer between the input sensing layer 40 and the display panel 10 may be omitted. FIG. 2A illustrates an embodiment in which the input sensing layer 40 is between the display panel 10 and the optical function layer 50, but in another embodiment, the input sensing layer 40 may be disposed on the optical function layer 50.

The optical function layer 50 may include an anti-reflection layer. The anti-reflection layer may reduce the reflectance of light (e.g., external light) incident from the outside toward the display panel 10. The anti-reflection layer may include a retarder and a polarizer. The retarder may be a film-type retarder or a liquid crystal coating-type retarder and may include a $\lambda/2$ retarder and/or a $\lambda/4$ retarder. The polarizer may be a film-type polarizer or a liquid crystal coating-type polarizer. The film-type polarizer may include a stretched synthetic resin film, and the liquid crystal coating-type polarizer may include liquid crystals arranged in a certain array. The retarder and the polarizer may each further include a protective film. The protective film of each of the retarder and the polarizer may be defined as the base layer of the anti-reflection layer.

In another embodiment, the anti-reflection layer may include a black matrix and color filters. The color filters may be arranged based on the color of light emitted from each pixel of the display panel 10. In another embodiment, the anti-reflection layer may include a destructive interference structure. The destructive interference structure may include a first reflective layer and a second reflective layer disposed on different layers from each other. First reflected light and second reflected light respectively reflected from the first reflective layer and the second reflective layer may destructively interfere with each other, and thus, the reflectance of external light may be reduced.

The optical function layer 50 may include a lens layer. The lens layer may improve light output efficiency of light emitted from the display panel 10 or may reduce a color deviation. The lens layer may include a layer having a concave or convex lens shape and/or may include a plurality of layers having different refractive indices from each other. The optical function layer 50 may include either or both of the anti-reflection layer and the lens layer described above.

In an embodiment, the optical function layer 50 may be formed continuously after the process of forming the display panel 10 and/or the input sensing layer 40. In such an embodiment, adhesive layer(s) between the optical function layer 50, the display panel 10, and/or the input sensing layer 40 may be omitted.

The display panel 10, the input sensing layer 40, and/or the optical function layer 50 may each have an opening (e.g., a hole or through hole). FIG. 2A illustrates an embodiment in which the display panel 10, the input sensing layer 40, and the optical function layer 50 have overlapping (e.g., aligned) first to third openings 10H, 40H, and 50H, respectively. The first to third openings 10H, 40H, and 50H may be located to correspond to the opening area OA. In another embodiment, one or more of the display panel 10, the input sensing layer 40, and the optical function layer 50 may not have an opening. For example, one or two elements selected from the display panel 10, the input sensing layer 40, and the optical function layer 50 may not have an opening. In another embodiment, as illustrated in FIG. 2B, none of the display panel 10, the input sensing layer 40, and the optical function layer 50 may have an opening.

The opening area OA may be a component area (e.g., a sensor area, a camera area, a speaker area, etc.) at where a component 20 for providing various functions to the display device 1 is located. As illustrated in FIG. 2A, the component 20 may be located in the first to third openings 10H, 40H, and 50H. Alternatively, as illustrated in FIG. 2B, the component 20 may be disposed under the display panel 10.

The component 20 may include (or may be) an electronic element. For example, the component 20 may be an electronic element using light or sound. Examples of the electronic element may include a sensor (e.g., an infrared sensor) configured to output and/or receive light, a camera configured to receive light and capture an image, a sensor configured to output and sense light or sound and measure distance or recognize fingerprints, a small lamp configured to output light, and a speaker configured to output sound. The electronic element using light may use light of various wavelength bands, such as visible light, infrared light, or ultraviolet light. In some embodiments, the opening area OA may be understood as a transmission area through which light and/or sound output from the component 20 passes to the outside or light and/or sound traveling from the outside passes toward the electronic element.

In another embodiment, when the display device 1 is used as a smart watch or part of a vehicle dashboard, the component 20 may be a member such as a watch hand or a needle indicating certain information (e.g., vehicle speed, etc.). When the display device 1 includes a watch hand or is part of a vehicle dashboard, the component 20 may be exposed to the outside through the window 60, and the window 60 may have an opening corresponding to the opening area OA.

The component 20 may include element(s) related to the functions of the display panel 10, as described above, or may include an element such as accessories that increase the aesthetic perception of the display panel 10. In various embodiments, an optical clear adhesive or the like may be between the window 60 and the optical function layer 50.

FIGS. 3A to 3D are cross-sectional views schematically illustrating a display device 1 according to embodiments.

Figure 3A:
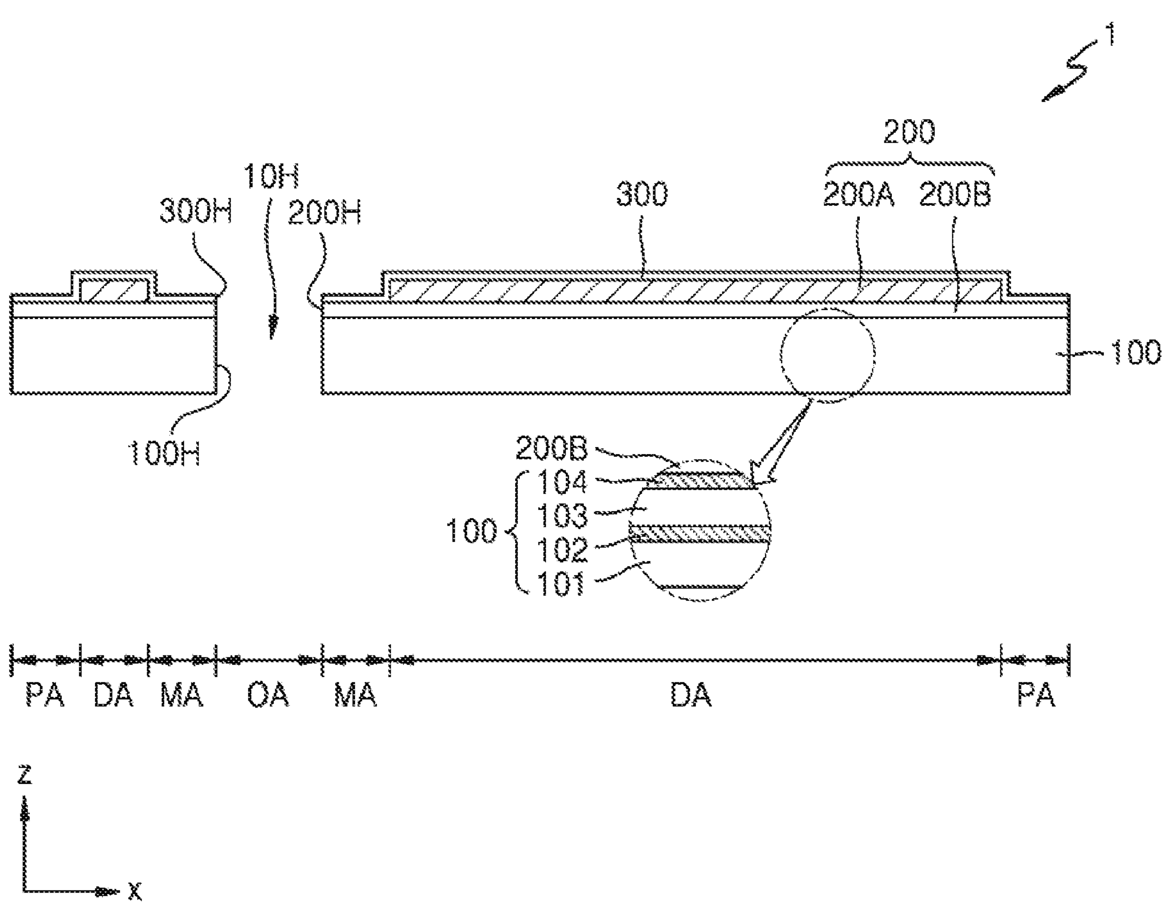
FIGS. 3A to 3D are cross-sectional views schematically illustrating a display device according to embodiments.

Referring to FIG. 3A, the display device 1 includes a display layer 200 on a substrate 100. The substrate 100 may include glass or polymer resin. The substrate 100 may include multiple layers. For example, as illustrated in the enlarged view of FIG. 3A, the substrate 100 may include a first base layer 101, a first barrier layer 102, a second base layer 103, and a second barrier layer 104.

The first base layer 101 and the second base layer 103 may each include polymer resin. For example, the first base layer 101 and the second base layer 103 may each include polymer resin, such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), or cellulose acetate propionate (CAP). The polymer resin may be transparent.

The first barrier layer 102 and the second barrier layer 104 are barrier layers that prevent infiltration of foreign matter and may each be a single layer or multiple layers including an inorganic material, such as silicon nitride ($SiN_x$, x>0), silicon oxynitride (SiON), or silicon oxide ($SiO_x$, x>0).

The display layer 200 includes a plurality of pixels. The display layer 200 may include a display element layer 200A including display elements arranged for each pixel and a pixel circuit layer 200B including a pixel circuit and insulating layers arranged for each pixel. The pixel circuit may include a thin-film transistor and a storage capacitor. The display elements may each include an organic light-emitting diode (OLED).

The display elements of the display layer 200 may be covered with an encapsulation member, such as a thin-film encapsulation layer 300. The thin-film encapsulation layer 300 may include at least one inorganic encapsulation layer and at least one organic encapsulation layer. When the display device 1 includes the substrate 100 including the polymer resin and the thin-film encapsulation layer 300 including at least one inorganic encapsulation layer and at least one organic encapsulation layer, the flexibility of the display device 1 may be improved.

The display device 1 may have a first opening 10H passing through a display panel. The first opening 10H may be located in an opening area OA. FIG. 3A illustrates an embodiment in which the substrate 100 and the thin-film encapsulation layer 300 respectively have through holes 100H and 300H corresponding to the first opening of the display panel. The display layer 200 may also have a through hole 200H corresponding to the opening area OA.

Figure 3B:
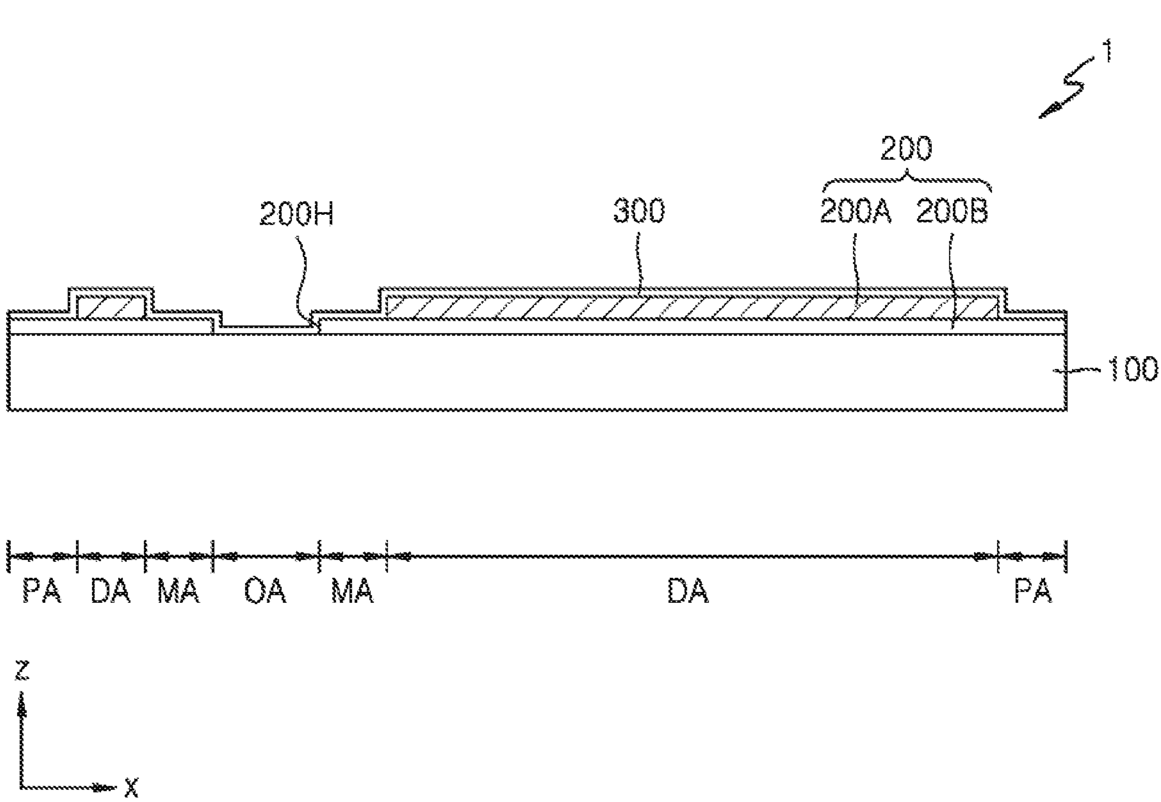

In another embodiment, as illustrated in FIG. 3B, the substrate 100 may not have a through hole corresponding to the opening area OA. The display layer 200 may have the through hole 200H corresponding to the opening area OA. The thin-film encapsulation layer 300 may not have a through hole corresponding to the opening area OA. In another embodiment, as illustrated in FIG. 3C, the display layer 200 may not have the through hole 200H corresponding to the opening area OA, but the display element layer 200A may not be located in the opening area OA.

Figure 3C:
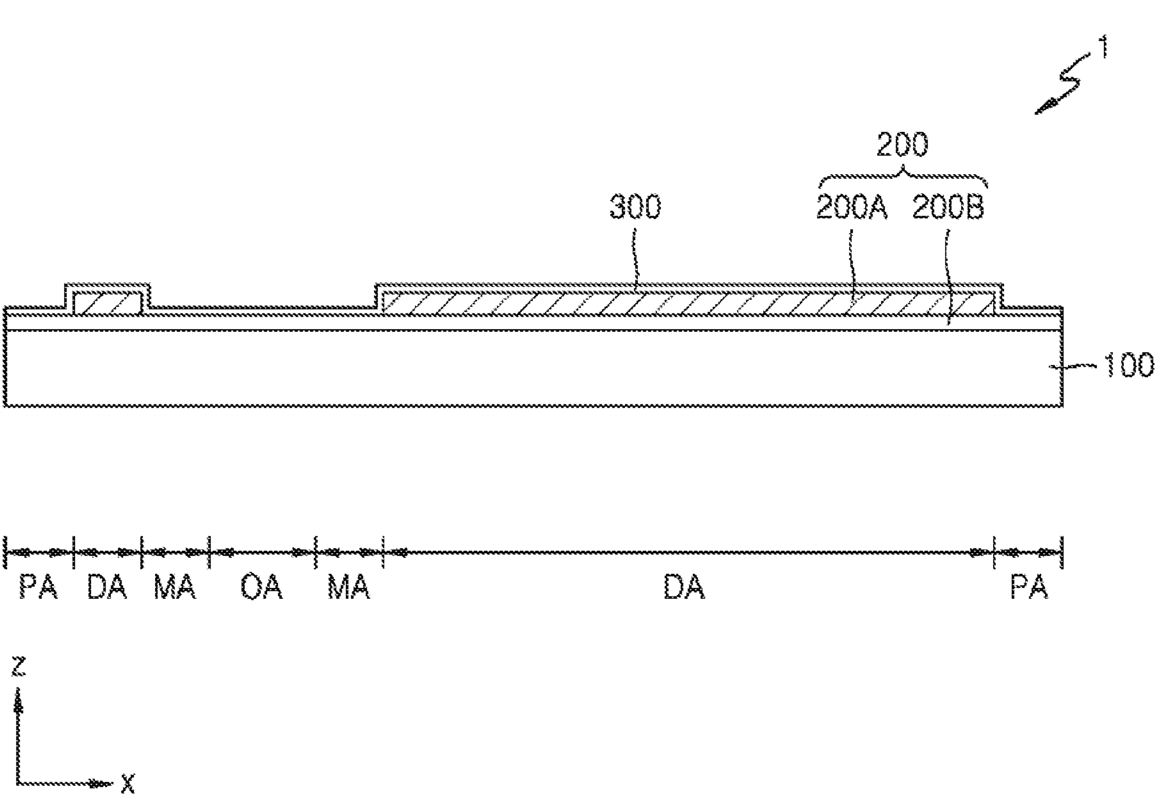
Figure 3D:
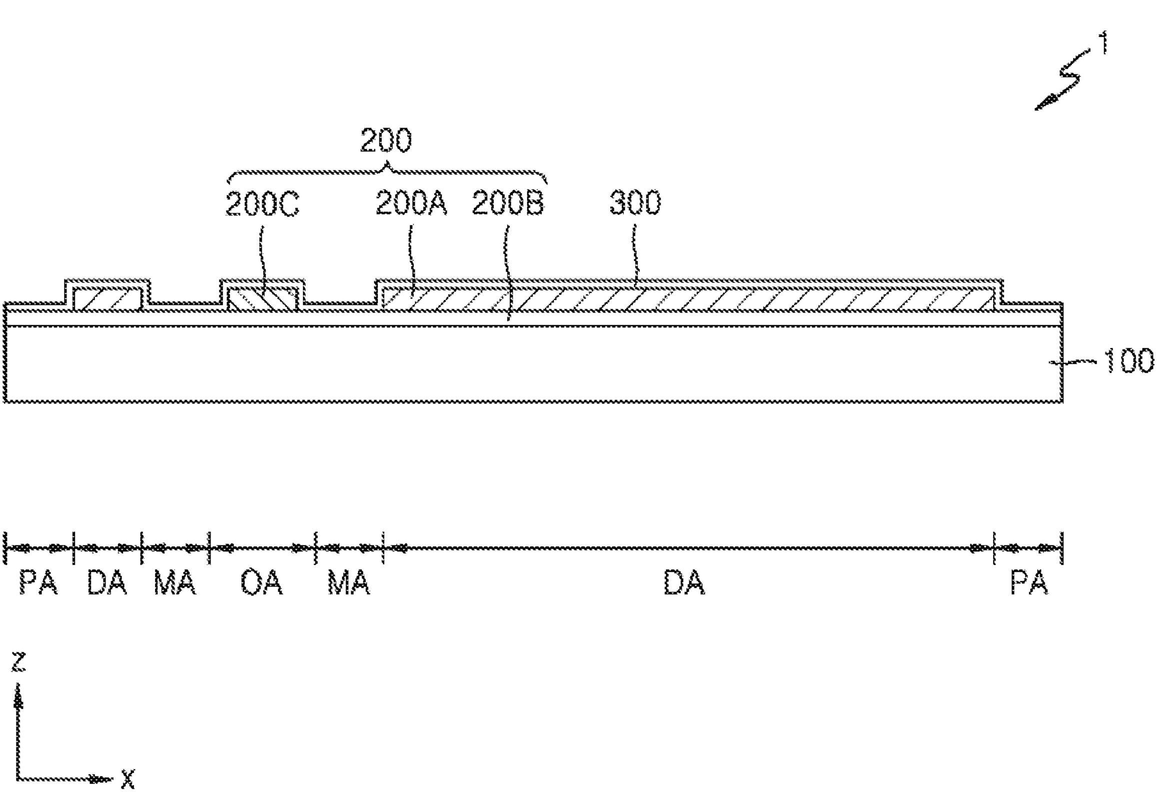

FIGS. 3A to 3C illustrate that the display element layer 200A is not arranged in the opening area OA, but the present disclosure is not limited thereto. In another embodiment, as illustrated in FIG. 3D, an auxiliary display element layer 200C may be located in the opening area OA. The auxiliary display element layer 200C may include a display element having a structure that is different from that of the display element of the display element layer 200A and/or operating according to a method that is different from that of the display element of the display element layer 200A.

In an embodiment, the pixels of the display element layer 200A may each include an active OLED, and the auxiliary display element layer 200C may include pixels each including a passive OLED. When the auxiliary display element layer 200C includes a passive OLED as a display element, elements constituting the pixel circuit may not be present under the passive OLED. For example, a portion of the pixel circuit layer 200B under the auxiliary display element layer 200C may not include a thin-film transistor and a storage capacitor.

In another embodiment, the auxiliary display element layer 200C may include the same type of display element (e.g., an active OLED) as the display element layer 200A, but the structure of the pixel circuit thereunder may be different. For example, the pixel circuit under the auxiliary display element layer 200C (e.g., the pixel circuit having a light blocking layer between the substrate and the thin-film transistor, etc.) may have a structure that is different from that of the pixel circuit under the display element layer 200A. In another embodiment, the display elements of the auxiliary display element layer 200C may operate according to a control signal that is different from that of the display elements of the display element layer 200A. A component that does not require relatively high transmittance (e.g., an infrared sensor, etc.) may be arranged in the opening area OA in which the auxiliary display element layer 200C is arranged. In such an embodiment, the opening area OA may be understood as a component area and an auxiliary display area.

FIGS. 4A to 4D are cross-sectional views schematically illustrating a display device 1 according to embodiments. While the display device 1 described above with reference to FIGS. 3A to 3D includes the thin-film encapsulation layer 300, the display device 1 described below with reference to FIGS. 4A to 4D may include an encapsulation substrate 300A and a sealant 340.

Figure 4A:
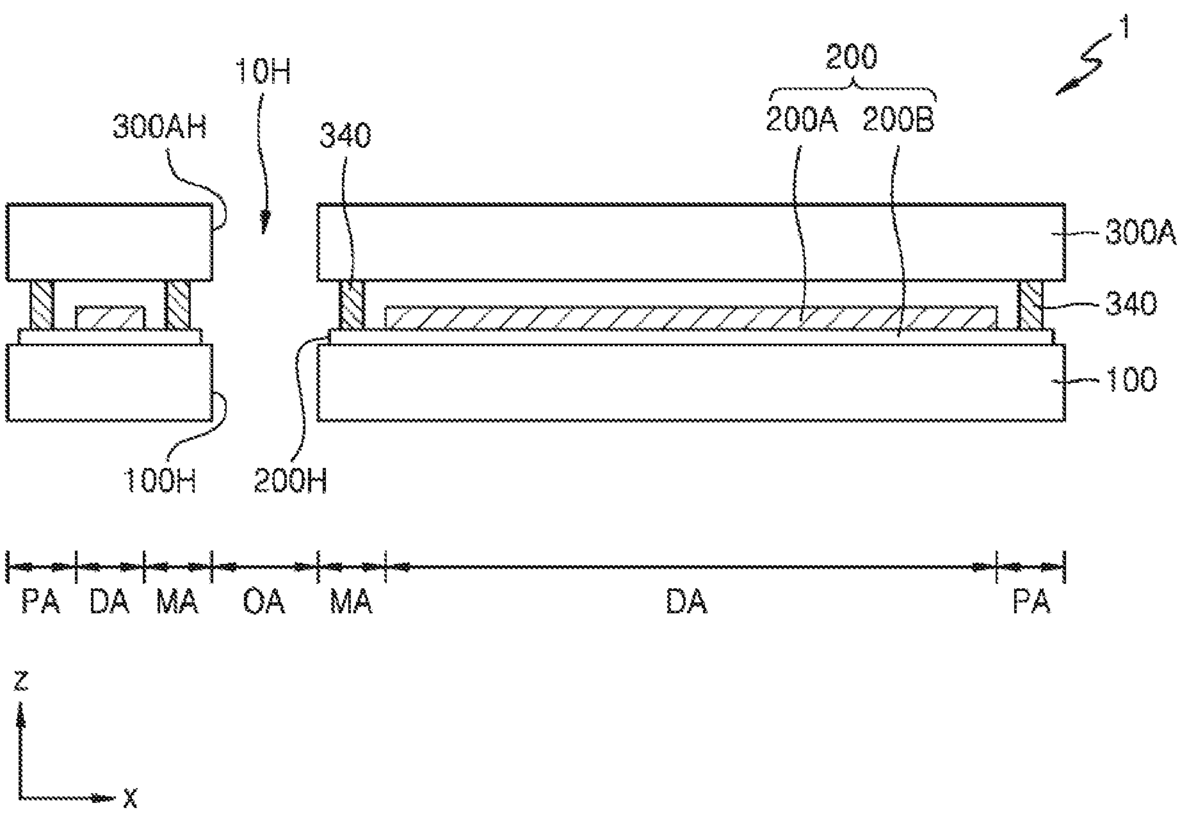
FIGS. 4A to 4D are cross-sectional views schematically illustrating a display device according to embodiments.
Figure 4B:
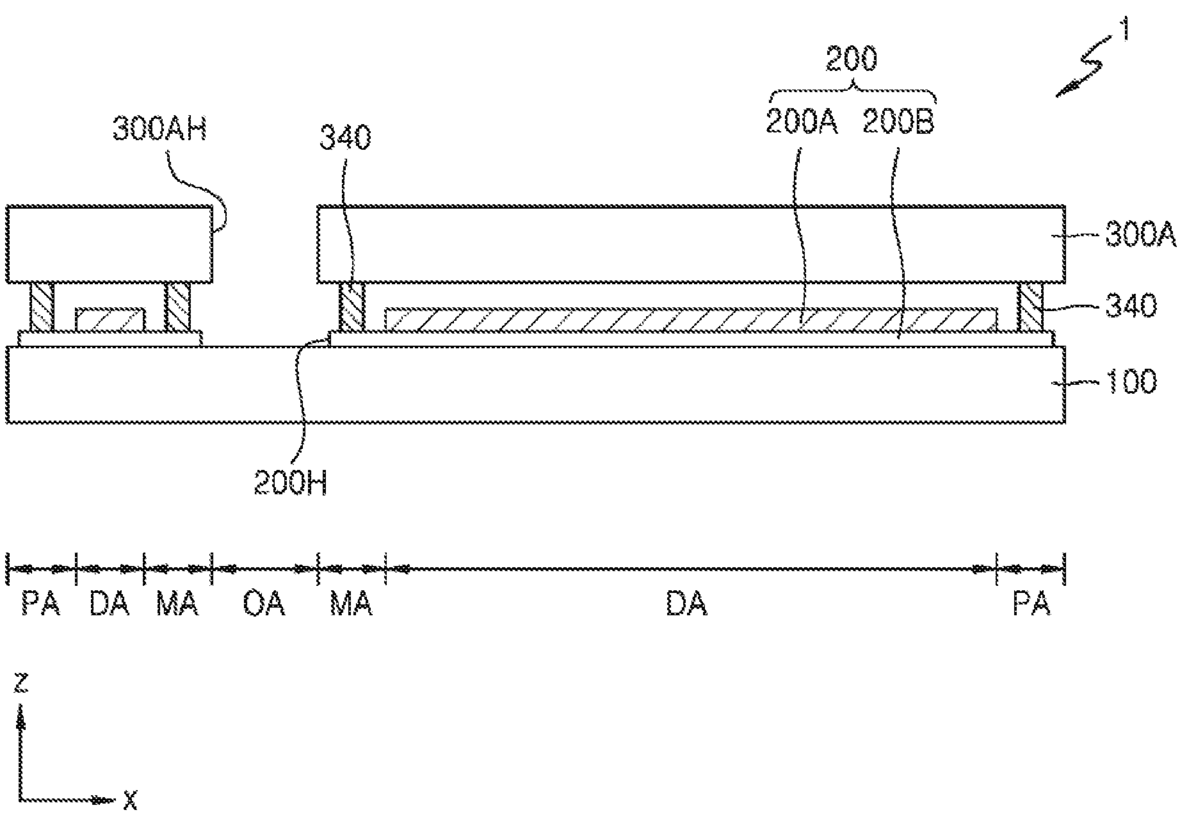
Figure 4C:
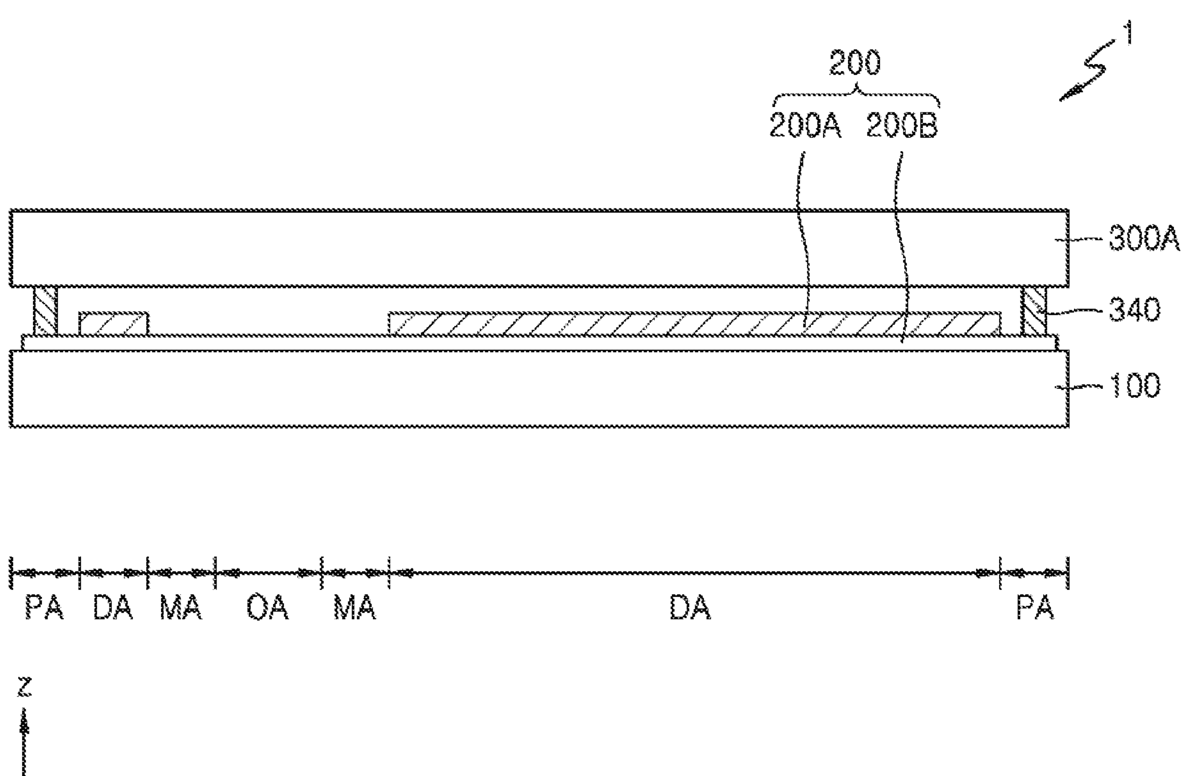
Figure 4D:
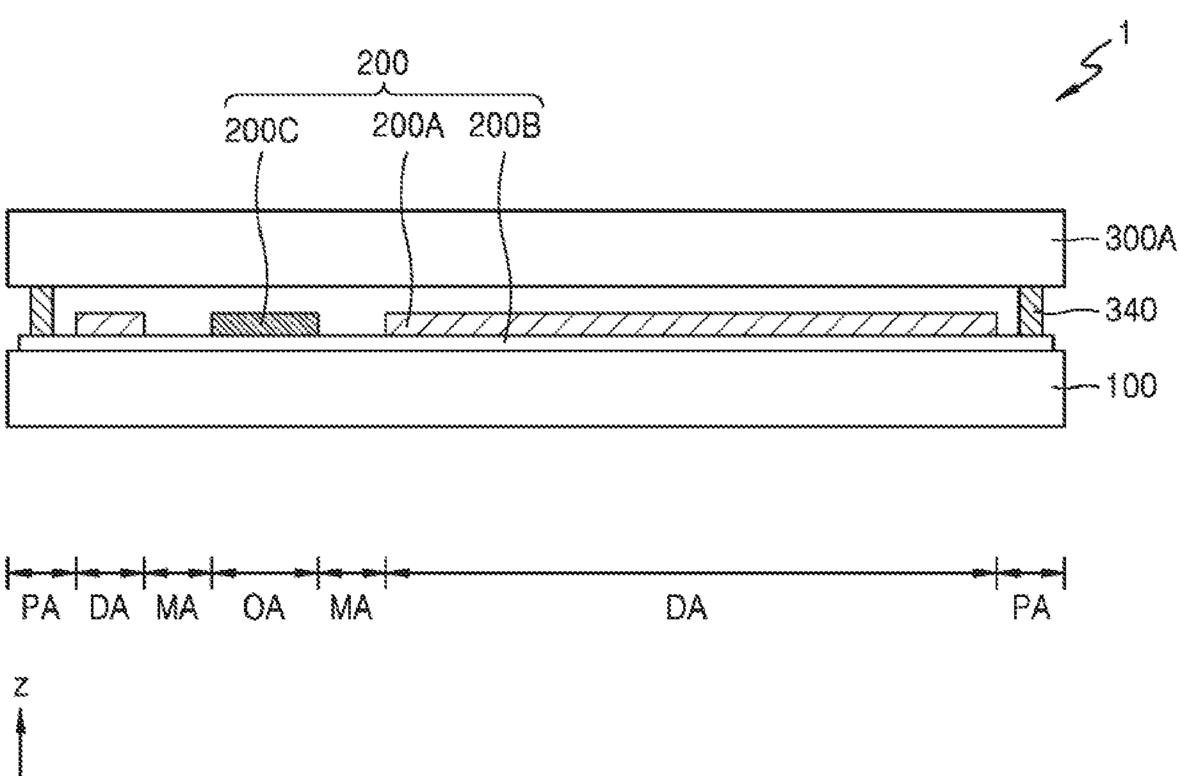

As illustrated in FIGS. 4A to 4C, one or more of a substrate 100, a display layer 200, and the encapsulation substrate 300A may have through holes 100H, 200H, and 300AH corresponding to an opening area OA. A display element layer 200A may not be arranged in the opening area OA. In another embodiment, as illustrated in FIG. 4D, an auxiliary display element layer 200C may be arranged in the opening area OA. The auxiliary display element layer 200C is the same as described above with reference to FIG. 3D.

Figure 5:
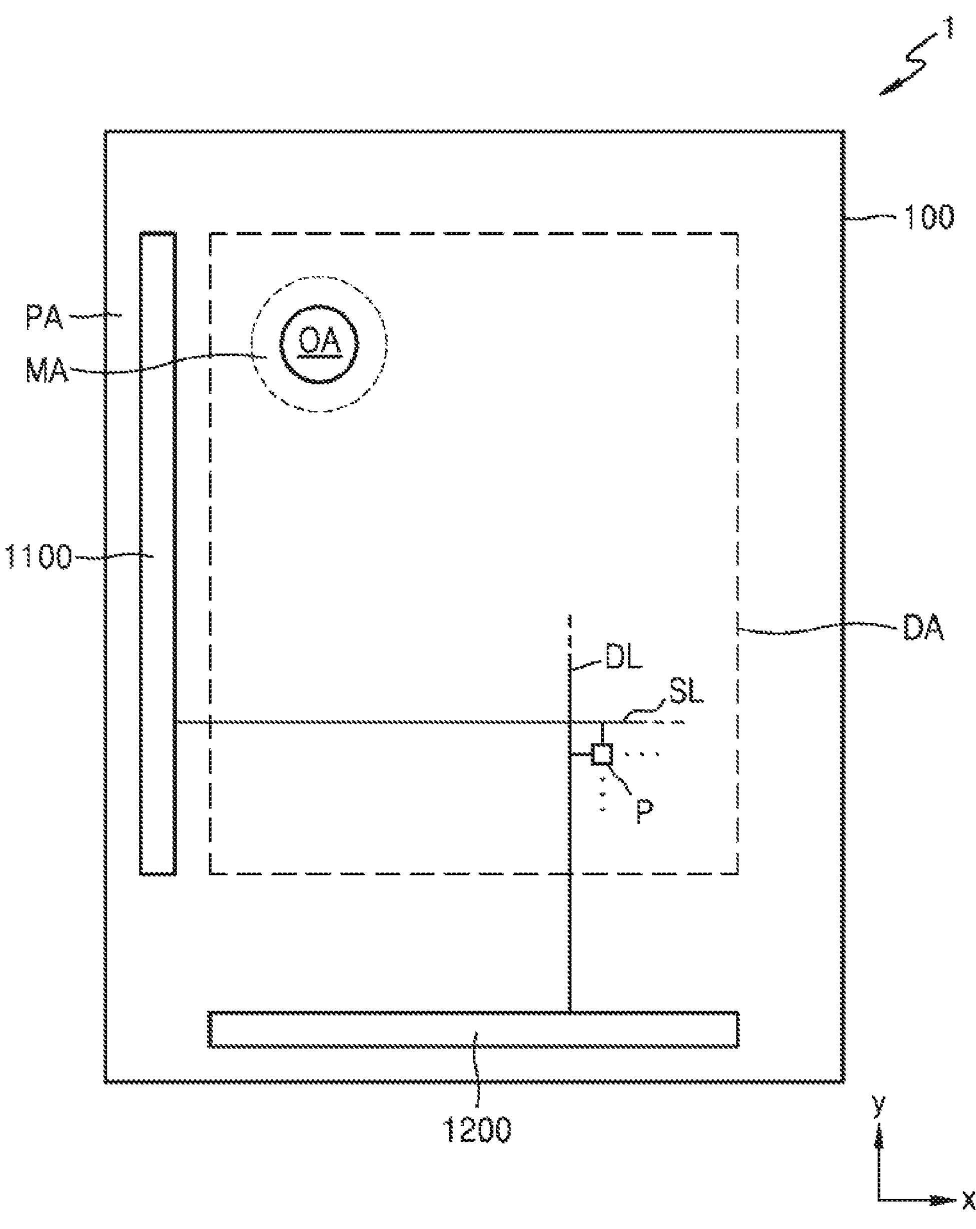
FIG. 5 is a plan view schematically illustrating a display device according to an embodiment.
Figure 6:
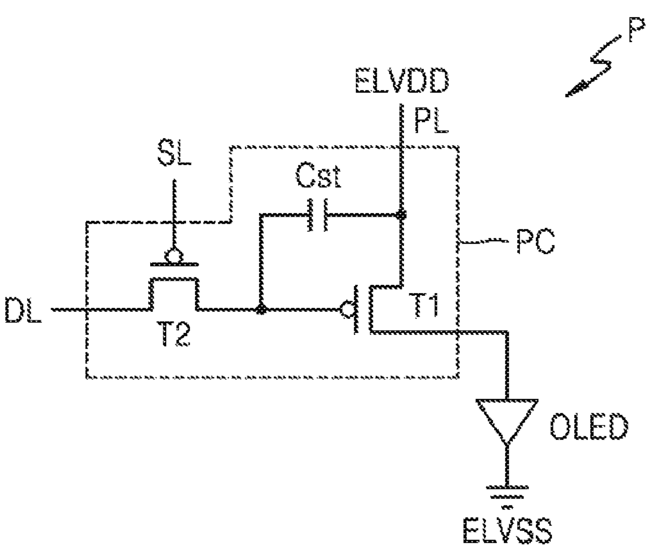
FIG. 6 is an equivalent circuit diagram schematically illustrating a pixel in a display device according to an embodiment.

FIG. 5 is a plan view schematically illustrating a display device 1 according to an embodiment, and FIG. 6 is an equivalent circuit diagram schematically illustrating a pixel in the display device 1 according to an embodiment.

Referring to FIG. 5, the display device 1 may have an opening area OA, a display area DA, a middle area MA, and a peripheral area PA. The embodiment shown in FIG. 5 has a substrate 100 in the display device 1. For example, the substrate 100 has the opening area OA, the display area DA, the middle area MA, and the peripheral area PA.

The display device 1 includes a plurality of pixels P in the display area DA. As illustrated in FIG. 6, the pixels P may each include a pixel circuit PC and an organic light-emitting diode OLED as a display element connected to the pixel circuit PC. The pixel circuit PC may include a first thin-film transistor T1, a second thin-film transistor T2, and a storage capacitor Cst. The pixels P may each emit red light, green light, or blue light through the organic light-emitting diode OLED or may each emit red light, green light, blue light, or white light through the organic light-emitting diode OLED.

The second thin-film transistor T2, which acts as a switching thin-film transistor, may be connected to a scan line SL and a data line DL and may be configured to transmit, to the first thin-film transistor T1, a data voltage input from the data line DL in response to a switching voltage input from the scan line SL. The storage capacitor Cst may be connected to the second thin-film transistor T2 and a driving voltage line PL and may be configured to store a voltage corresponding to a difference between a voltage received from the second thin-film transistor T2 and a first power supply voltage ELVDD supplied to the driving voltage line PL.

The first thin-film transistor T1, which acts as a driving thin-film transistor. may be connected to the driving voltage line PL and the storage capacitor Cst and may be configured to control a driving current flowing from the driving voltage line PL to the organic light-emitting diode OLED according to a voltage value stored in the storage capacitor Cst. The organic light-emitting diode OLED may emit light having a certain luminance according to the driving current. An opposite electrode (e.g., a cathode) of the organic light-emitting diode OLED may be configured to receive a second power supply voltage ELVSS.

FIG. 6 illustrates an embodiment in which the pixel circuit PC includes two thin-film transistors and one storage capacitor, but the present disclosure is not limited thereto. The number of thin-film transistors and the number of storage capacitors may be variously changed according to the design of the pixel circuit PC. For example, the pixel circuit PC may include four or more thin-film transistors.

Referring back to FIG. 5, the middle area MA may surround the opening area OA in a plan view. The middle area MA is an area in which the display element, such as the organic light-emitting diode OLED, that emits light is not arranged. Signal lines configured to provide signals to the pixels P arranged around the opening area OA may pass through the middle area MA. A scan driver 1100 configured to provide a scan signal to the pixels P, a data driver 1200 configured to provide a data signal to the pixels P; and main power lines configured to provide a first power supply voltage and a second power supply voltage may be arranged in the peripheral area PA. FIG. 5 illustrates that the data driver 1200 is arranged adjacent to one side of the substrate 100, but in another embodiment, the data driver 1200 may be disposed on a flexible printed circuit board (FPCB) electrically connected to a pad that is arranged at one side (e.g., at another surface) of the display device 1.

Figure 7:
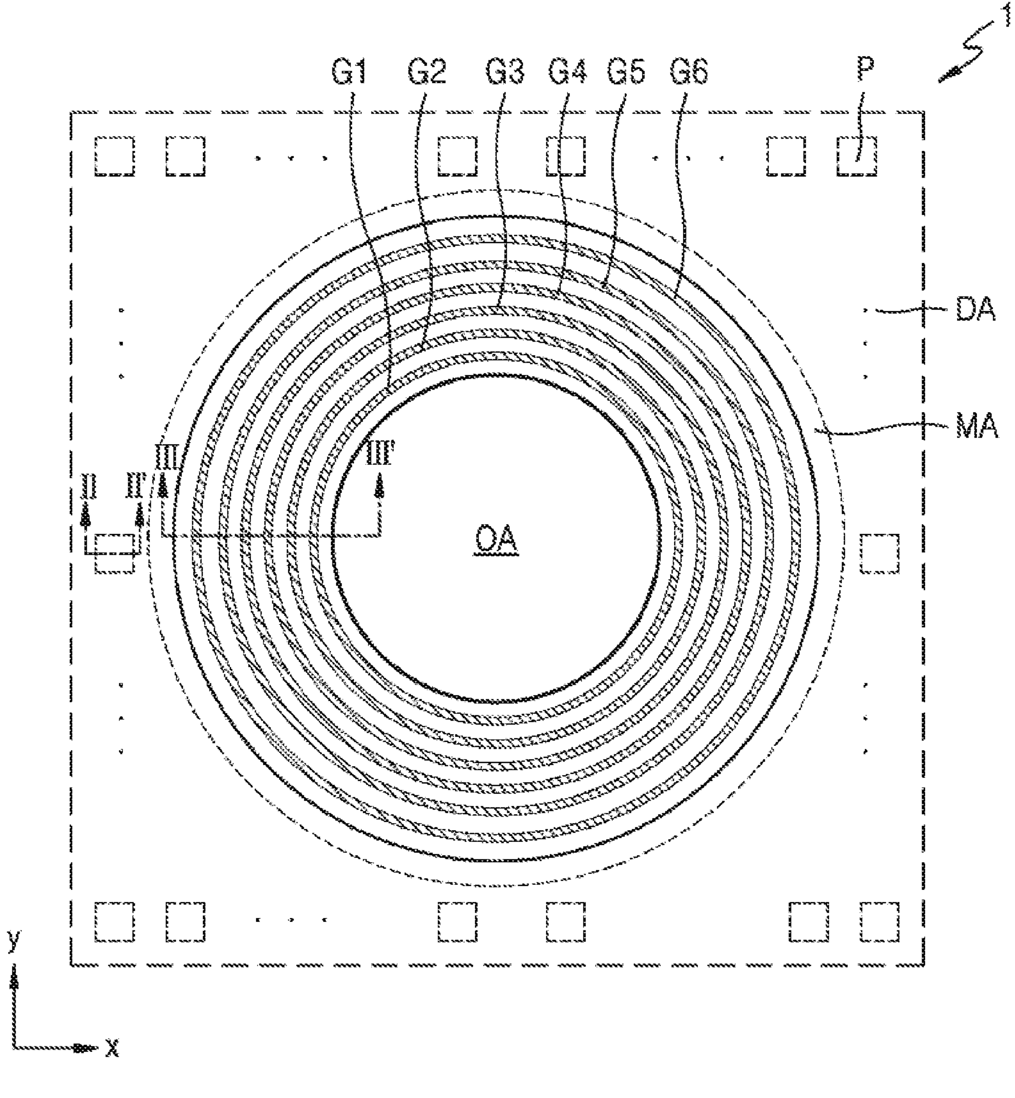
FIG. 7 is a plan view illustrating a portion of a display device according to an embodiment.

FIG. 7 is a plan view illustrating a portion of a display device 1 according to an embodiment.

Referring to FIG. 7, pixels P are arranged in a display area DA around an opening area OA. Some pixels P may be spaced apart from each other with respect to the opening area OA, and the opening area OA may be defined between some of the pixels P. For example, in the plan view of FIG. 7, some pixels P may be disposed above and below the opening area OA, and some pixels P may be arranged on the left and right sides of the opening area OA.

One or more grooves G1 to G6 may be arranged in the middle area MA. Although FIG. 7 illustrates six grooves G1 to G6, the present disclosure is not limited thereto. For example, three, four, or five grooves may be located in the middle area MA, or seven or more grooves may be located in the middle area MA. In a plan view, the grooves G1 to G6 may each have a ring shape (e.g., a closed loop shape) surrounding (or extending around) the opening area OA, and the grooves G1 to G6 may be spaced apart from each other (e.g., may be spaced apart from each other radially).

Figure 8:
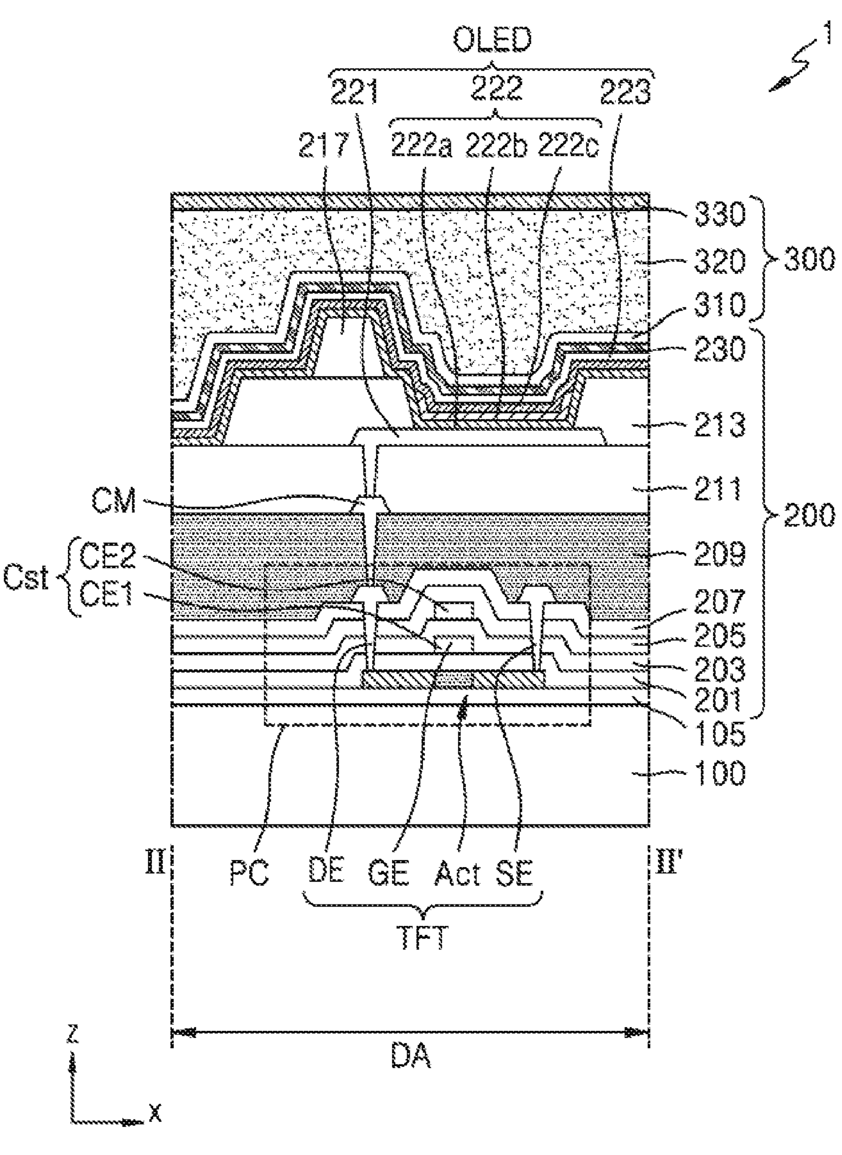
FIG. 8 is a cross-sectional view taken along the line II-II' of FIG. 7.

FIG. 8 is a cross-sectional view schematically illustrating a display device 1 according to an embodiment. FIG. 8 is a cross-sectional view of the display device 1 taken along the line II-II' of FIG. 7 according to an embodiment.

Referring to FIG. 8, a substrate 100 may include glass or polymer resin. In an embodiment, the substrate 100 may include a plurality of sub-layers, as illustrated in the enlarged view of FIG. 3A.

A buffer layer 105 may be disposed on the substrate 100. The buffer layer 105 may prevent infiltration of impurities into a semiconductor layer Act of a thin-film transistor TFT. The buffer layer 105 may include an inorganic insulating material, such as silicon nitride, silicon oxynitride, and silicon oxide, and may be a single layer or may include multiple layers including the inorganic insulating material as described above.

A pixel circuit PC may be disposed on the buffer layer 105. The pixel circuit PC may include a thin-film transistor TFT and a storage capacitor Cst. The thin-film transistor TFT may include the semiconductor layer Act, a gate electrode GE, a source electrode SE, a drain electrode DE.

FIG. 8 illustrates an embodiment in which the thin-film transistor TFT is a top gate type in which the gate electrode GE is disposed on the semiconductor layer Act with a first insulating layer 201 therebetween, but in another embodiment, the thin-film transistor TFT may be a bottom gate type.

The semiconductor layer Act may include polysilicon. In other embodiments, the semiconductor layer Act may include amorphous silicon, an oxide semiconductor, or an organic semiconductor. The gate electrode GE may include a low-resistance metal material. The gate electrode GE may include a conductive material including molybdenum (Mo), aluminum (Al), copper (Cu), titanium (Ti), and the like, and may be a single layer or may include multiple layers including the conductive material as described above.

The first insulating layer 201 between the semiconductor layer Act and the gate electrode GE may include an inorganic insulating material, such as silicon oxide, silicon nitride, silicon oxynitride, aluminum oxide, titanium oxide, tantalum oxide, and hafnium oxide. The first insulating layer 201 may be a single layer or may include multiple layers including the inorganic insulating material as described above.

The source electrode SE and the drain electrode DE may each include a material having good conductivity. The source electrode SE and the drain electrode DE may each include a conductive material including molybdenum (Mo), aluminum (Al), copper (Cu), titanium (Ti), and the like, and may be a single layer or may include multiple layers including the conductive material as described above. In an embodiment, the source electrode SE, the drain electrode DE, and a data line DL may each have a multilayer structure including a titanium layer, an aluminum layer, and a titanium layer (Ti/Al/Ti).

The storage capacitor Cst may include a lower electrode CE1 and an upper electrode CE2 that overlap each other with a second insulating layer 203 therebetween. The storage capacitor Cst may overlap the thin-film transistor TFT. FIG. 8 illustrates an embodiment in which the gate electrode GE of the thin-film transistor TFT is the lower electrode CE1 of the storage capacitor Cst. In another embodiment, the storage capacitor Cst may not overlap (e.g., may be offset from) the thin-film transistor TFT. The storage capacitor Cst may be covered with a third insulating layer 205. The upper electrode CE2 of the storage capacitor Cst may include a conductive material including molybdenum (Mo), aluminum (Al), copper (Cu), titanium (Ti), and the like, and may be a single layer or may include multiple layers including the conductive material as described above.

A fourth insulating layer 207 may be disposed on the third insulating layer 205. The second insulating layer 203, the third insulating layer 205, and the fourth insulating layer 207 may each include an inorganic insulating material, such as silicon oxide, silicon nitride, silicon oxynitride, aluminum oxide, titanium oxide, tantalum oxide, and hafnium oxide. The second insulating layer 203, the third insulating layer 205, and the fourth insulating layer 207 may each be a single layer or may include multiple layers including the inorganic insulating material as described above.

The pixel circuit PC including the thin-film transistor TFT and the storage capacitor Cst may be covered with a first organic insulating layer 209. The first organic insulating layer 209 may have a substantially flat upper surface.

The pixel circuit PC may be electrically connected to a pixel electrode 221. For example, as illustrated in FIG. 8, a contact metal layer CM may be between the thin-film transistor TFT and the pixel electrode 221. The contact metal layer CM may be connected to the thin-film transistor TFT through a contact hole (e.g., a contact opening) formed in the first organic insulating layer 209, and the pixel electrode 221 may be connected to the contact metal layer CM through a contact hole (e.g., a contact opening) formed in a second organic insulating layer 211 on the contact metal layer CM. The contact metal layer CM may include a conductive material including molybdenum (Mo), aluminum (Al), copper (Cu), titanium (Ti), and the like, and may be a single layer or may include multiple layers including the conductive material as described above. In an embodiment, the contact metal layer CM may have a multilayer structure of Ti/Al/Ti.

The first organic insulating layer 209 and the second organic insulating layer 211 may each include an organic insulating material selected from general-purpose polymers, such as polymethylmethacrylate (PMMA) or polystyrene (PS), polymer derivatives having a phenolic group, an acrylic polymer, an imide-based polymer, an aryl ether-based polymer, an amide-based polymer, a fluorine-based polymer, a p-xylene-based polymer, a vinyl alcohol-based polymer, and any blend thereof. In an embodiment, the first organic insulating layer 209 and the second organic insulating layer 211 may each include polyimide.

The pixel electrode 221 may be disposed on the second organic insulating layer 211. The pixel electrode 221 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In another embodiment, the pixel electrode 221 may further include a layer including ITO, IZO, ZnO, or $In_2O_3$ above and/or below the reflective layer.

A third organic insulating layer 213 may be disposed on the pixel electrode 221. The third organic insulating layer 213 may be a pixel defining layer defining an emission area of a pixel. The third organic insulating layer 213 may include an opening exposing at least a portion of the upper surface of the pixel electrode 221 and may cover an edge of the pixel electrode 221. The third organic insulating layer 213 may include an organic insulating material. In other embodiments, the third organic insulating layer 213 may include an inorganic insulating material, such as silicon nitride ($SiN_x$), silicon oxynitride (SiON), or silicon oxide ($SiO_x$). In other embodiments, the third organic insulating layer 213 may include an organic insulating material and an inorganic insulating material.

An intermediate layer 222 includes an emission layer **222*b*. The intermediate layer 222 may also include a first functional layer 222*a* disposed below the emission layer 222*b* and/or a second functional layer 222*c* disposed above the emission layer 222*b*. The emission layer 222*b*** may include a high molecular weight organic material or a low molecular weight organic material that emits light of a certain color.

The first functional layer **222*a* may be a single layer or may include multiple layers. For example, when the first functional layer 222*a* include a polymer material, the first functional layer 222*a* may be a single-layered hole transport layer (HTL) and may include polyethylene dihydroxythiophene (PEDOT; poly-(3,4)-ethylene-dihydroxy thiophene) or polyaniline (PANI). When the first functional layer 222*a*** includes a low molecular weight material, the first functional layer 222*a* may include a hole injection layer (HIL) and an HTL.

The second functional layer 222*c* is optional. For example, the second functional layer 222*c* may be included when the first functional layer 222*a* and the emission layer 222*b* include a polymer material. The second functional layer 222*c* may be a single layer or may include multiple layers. The second functional layer 222*c* may include an electron transport layer (ETL) and/or an electron injection layer (EIL).

The emission layer 222*b* of the intermediate layer 222 may be provided in the display area DA for each pixel. The emission layer 222*b* may be patterned to correspond to the pixel electrode 221. Different from the emission layer 222*b*, the first functional layer 222*a* and/or the second functional layer 222*c* of the intermediate layer 222 may extend toward the middle area MA to be located in the middle area MA as well as in the display area DA.

An opposite electrode 223 may include a conductive material having a low work function. For example, the opposite electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. In other embodiments, the opposite electrode 223 may further include a layer including ITO, IZO, ZnO, or $In_2O_3$ on the (semi)transparent layer including the material described above. The opposite electrode 223 may be arranged in the middle area MA as well as in the display area DA. The first functional layer 222*a*, the second functional layer 222*c*, and the opposite electrode 223 may be formed by thermal evaporation.

A capping layer 230 may be disposed on the opposite electrode 223. For example, the capping layer 230 may include LiF and may be formed by thermal evaporation. In some embodiments, the capping layer 230 may be omitted.

A fourth organic insulating layer 217 may be disposed on the third organic insulating layer 213. The fourth organic insulating layer 217 may include an organic insulating material, such as polyimide. In other embodiments, the fourth organic insulating layer 217 may include an inorganic insulating material or may include an organic insulating material and an inorganic insulating material.

The fourth organic insulating layer 217 may include a material that is different from that of the third organic insulating layer 213 or may include the same material as that of the third organic insulating layer 213. In an embodiment, the third organic insulating layer 213 and the fourth organic insulating layer 217 may each include polyimide. The third organic insulating layer 213 and the fourth organic insulating layer 217 may be formed together (e.g., may be formed concurrently) in a mask process using a halftone mask.

The organic light-emitting diode OLED is covered with a thin-film encapsulation layer 300. The thin-film encapsulation layer 300 may include at least one organic encapsulation layer and at least one inorganic encapsulation layer. FIG. 8 illustrates an embodiment in which the thin-film encapsulation layer 300 includes first and second inorganic encapsulation layers 310 and 330 and an organic encapsulation layer 320 therebetween. However, the number of organic encapsulation layers, the number of inorganic encapsulation layers, and the stacking order thereof may be changed.

The first inorganic encapsulation layer 310 and the second inorganic encapsulation layer 330 may each include at least one inorganic material selected from aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may each be a single layer or may include multiple layers including the inorganic material described above. The organic encapsulation layer 320 may include a polymer-based material. The polymer-based material may include PMMA, an acrylic resin (e.g., polyacrylic acid), an epoxy-based resin, polyimide, polyethylene, and the like. In an embodiment, the organic encapsulation layer 320 may include acrylate polymer.

A material of the first inorganic encapsulation layer 310 may be different from a material of the second inorganic encapsulation layer 330. For example, the first inorganic encapsulation layer 310 may include silicon oxynitride, and the second inorganic encapsulation layer 330 may include silicon nitride. The thickness of the first inorganic encapsulation layer 310 may be different from the thickness of the second inorganic encapsulation layer 330. The thickness of the first inorganic encapsulation layer 310 may be greater than the thickness of the second inorganic encapsulation layer 330. In other embodiments, the thickness of the second inorganic encapsulation layer 330 may be greater than the thickness of the first inorganic encapsulation layer 310, or the thicknesses of the first inorganic encapsulation layer 310 may be equal to the thickness of the second inorganic encapsulation layer 330.

Figure 9:
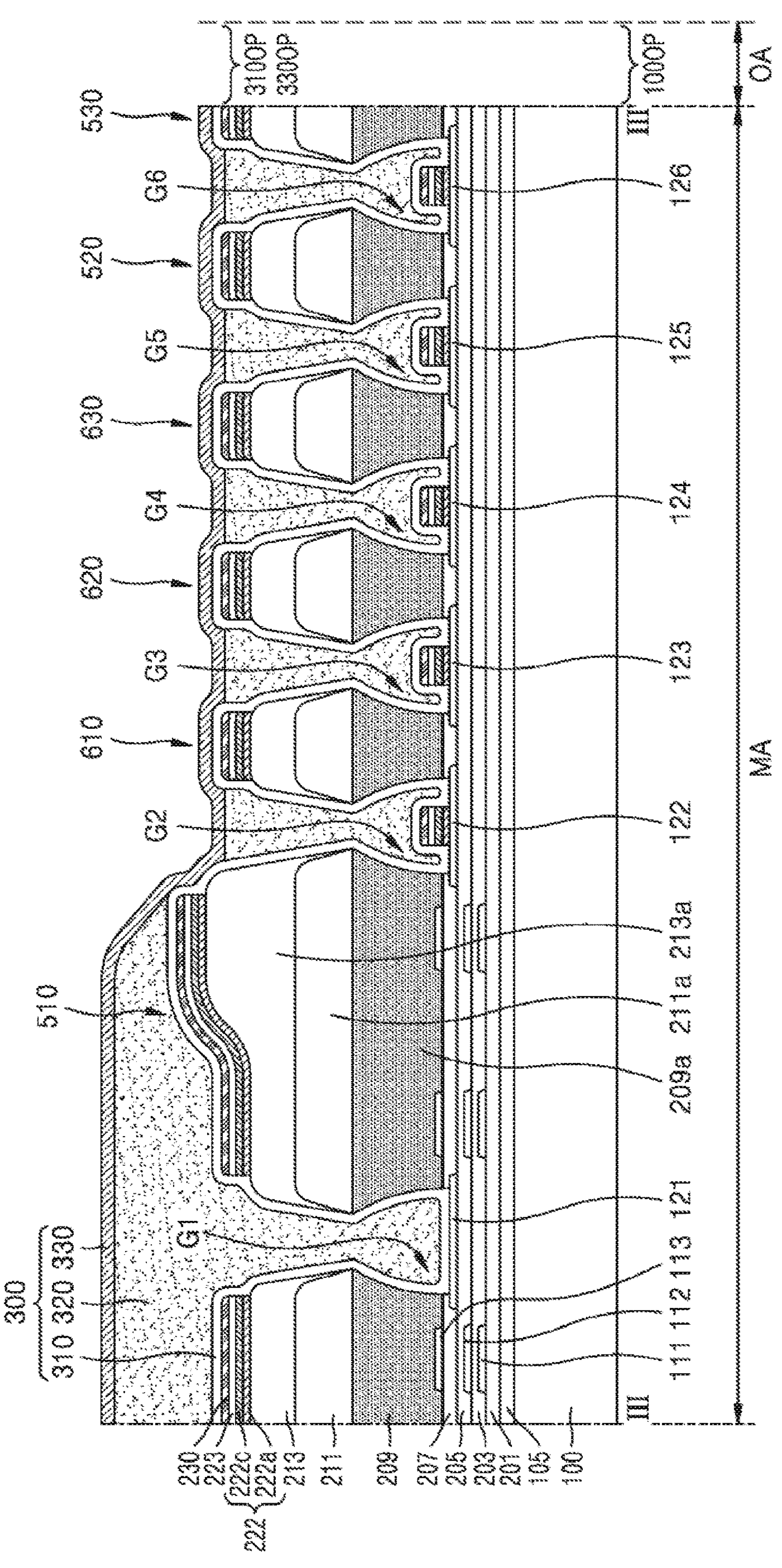
FIG. 9 is a cross-sectional view taken along the line III-III' of FIG. 7.

FIG. 9 is a cross-sectional view schematically illustrating a display device according to an embodiment. FIG. 9 is a cross-sectional view of the display device 1 taken along the line III-III' of FIG. 7 according to an embodiment.

Referring to FIG. 9, dams 510 and 520, grooves G1 to G6, separators 610, 620, and 630, and a crack dam 530 may be arranged in the middle area MA. The dams 510 and 520 may include a first dam 510 and a second dam 520. However, the present disclosure is not limited thereto, and one or three or more dams may be located in the middle area MA.

The dams 510 and 520 may include a plurality of organic pattern layers, which are sequentially stacked. In an embodiment, the dams 510 and 520 may each have a structure in which a first organic pattern layer 209*a*, a second organic pattern layer 211*a*, and a third organic pattern layer 213*a* are sequentially stacked. However, the present disclosure is not limited thereto.

In an embodiment, in the first organic pattern layer 209*a* stacked under the dams 510 and 520, the width of the upper portion of the first organic pattern layer 209*a* may be greater than the width of the lower portion of the first organic pattern layer 209*a*. Also, the width of the second organic pattern layer 211*a* on the first organic pattern layer 209*a* may be greater than the width of the first organic pattern layer 209*a*. Also, the width of the third organic pattern layer 213*a* on the second organic pattern layer 211*a* may be greater than the width of the second organic pattern layer 211*a*. However, the present disclosure is not limited thereto.

In an embodiment, the height of the first dam 510 may be greater than the height of the second dam 520 and the separators 610, 620, and 630. Because the height of the first dam 510 is greater than the height of the second dam 520 and the separators 610, 620, and 630, the loss of monomer forming the organic encapsulation layer due to a cutting line may be minimized or prevented. In another embodiment, the height of the first dam 510 may be equal to the height of the second dam 520 and the separators 610, 620, and 630.

In an embodiment, the first dam 510 may be between the display area DA and the opening area OA. The first dam 510 may be arranged along (e.g., may extend along) the circumference of the opening area OA. The second dam 520 may be between the first dam 510 and the opening area OA. The second dam 520 may be arranged along (e.g., may extend along) the circumference of the opening area OA. The crack dam 530 may be between the second dam 520 and the opening area OA. The crack dam 530 may be arranged along (e.g., may extend along) the circumference of the opening area OA.

In an embodiment, the separators 610, 620, and 630 may be between the first dam 510 and the second dam 520. The separators 610, 620, and 630 may be arranged along (e.g., may extend along) the circumference of the opening area OA. The separators 610, 620, and 630 may include a first separator 610, a second separator 620, and a third separator 630. FIG. 9 illustrates an embodiment in which three separators are provided in the middle area MA, but the present disclosure is not limited thereto. In other embodiments, two or four or more separators may be provided in the middle area MA.

The separators 610, 620, and 630 may each include a plurality of organic pattern layers, which are sequentially stacked. For example, the separators 610, 620, and 630 may each have a structure in which a first organic pattern layer 209*a*, a second organic pattern layer 211*a*, and a third organic pattern layer 213*a* are sequentially stacked. However, the present disclosure is not limited thereto.

In an embodiment, the width of the upper portion of the first organic pattern layer 209*a* may be greater than the width of the lower portion of the first organic pattern layer 209*a*. Also, the width of the second organic pattern layer 211*a* on the first organic pattern layer 209*a* may be greater than the width of the first organic pattern layer 209*a*. Also, the width of the third organic pattern layer 213*a* on the second organic pattern layer 211*a* may be greater than the width of the second organic pattern layer 211*a*. However, the present disclosure is not limited thereto.

In an embodiment, the grooves G1, G2, G3, G4, G5, and G6 may be between the dams 510 and 520 and the separators 610, 620, and 630. For example, the first groove G1 may be defined between the display area (see, e.g., DA in FIG. 7) and the first dam 510. The second groove G2 may be defined between the first dam 510 and the first separator 610. The third groove G3 may be defined between the first separator 610 and the second separator 620. The fourth groove G4 may be defined between the second separator 620 and the third separator 630. The fifth groove G5 may be defined between the third separator 630 and the second dam 520. The sixth groove G6 may be defined between the second dam 520 and the crack dam 530.

In an embodiment, a buffer layer 105 may be disposed on a substrate 100. A first insulating layer 201, a second insulating layer 203, a third insulating layer 205, and a fourth insulating layer 207 may be sequentially disposed on the buffer layer 105. Also, a first organic insulating layer 209, a second organic insulating layer 211, and a third organic insulating layer 213 may be sequentially disposed on the fourth insulating layer 207. An intermediate layer 222 and an opposite electrode 223 may be disposed on the third organic insulating layer 213. The intermediate layer 222 and the opposite electrode 223 may extend from the display area DA to the middle area MA. A thin-film encapsulation layer 300 may be disposed on the opposite electrode 223. The thin-film encapsulation layer 300 may include a first inorganic encapsulation layer 310, an organic encapsulation layer 320, and a second inorganic encapsulation layer 330.

In an embodiment, the first inorganic encapsulation layer 310 and the second inorganic encapsulation layer 330 are in direct contact with each other on the dams 510 and 520, the separators 610, 620, and 630, and the crack dam 530.

Also, metal patterns may be between insulating layers. For example, a first metal pattern 111 may be between the first insulating layer 201 and the second insulating layer 203, a second metal pattern 112 may be between the second insulating layer 203 and the third insulating layer 205, and a third metal pattern 113 may be on the fourth insulating layer 207. In such an embodiment, the first metal pattern 111 may be disposed on the same layer as the gate electrode (see, e.g., GE in FIG. 8) and may include the same material as that of the gate electrode (see, e.g., GE in FIG. 8). The second metal pattern 112 may be disposed on the same layer as the upper electrode (see, e.g., CE2 in FIG. 8) and may include the same material as that of the upper electrode (see, e.g., CE2 in FIG. 8). The third metal pattern 113 may be disposed on the same layer as the drain electrode (see, e.g., DE in FIG. 8) and may include the same material as that of the drain electrode (see, e.g., DE in FIG. 8). FIG. 9 illustrates an embodiment in which three metal patterns are between the insulating layers, but the present disclosure is not limited thereto. For example, one or two metal patterns may be between the insulating layers.

In an embodiment, protective layers 121, 122, 123, 124, 125, and 126 may be between the third insulating layer 205 and the fourth insulating layer 207. The protective layers 121, 122, 123, 124, 125, and 126 may include a first protective layer 121, a second protective layer 122, a third protective layer 123, a fourth protective layer 124, a fifth protective layer 125, and a sixth protective layer 126. The protective layers 121, 122, 123, 124, 125, and 126 may each include polysilicon. In other embodiments, the protective layers 121, 122, 123, 124, 125, and 126 may each include amorphous silicon, an oxide semiconductor, or an organic semiconductor.

In an embodiment, the protective layers 121, 122, 123, 124, 125, and 126 may overlap the grooves G1, G2, G3, G4, G5, and G6, respectively. Specifically, the first protective layer 121 may overlap (e.g., may be in or aligned with) the first groove G1. The second protective layer 122 may overlap (e.g., may be in or aligned with) the second groove G2. The third protective layer 123 may overlap (e.g., may be in or aligned with) the third groove G3. The fourth protective layer 124 may overlap (e.g., may be in or aligned with) the fourth groove G4. The fifth protective layer 125 may overlap (e.g., may be in or aligned with) the fifth groove G5. The sixth protective layer 126 may overlap (e.g., may be in or aligned with) the sixth groove G6.

For example, the protective layers 121, 122, 123, 124, 125, and 126 may be between the grooves G1, G2, G3, G4, G5, and G6 and the substrate 100, respectively. The first protective layer 121 may be between the first groove G1 and the substrate 100. The second protective layer 122 may be between the second groove G2 and the substrate 100. The third protective layer 123 may be between the third groove G3 and the substrate 100. The fourth protective layer 124 may be between the fourth groove G4 and the substrate 100. The fifth protective layer 125 may be between the fifth groove G5 and the substrate 100. The sixth protective layer 126 may be between the sixth groove G6 and the substrate 100.

In an embodiment, the grooves G1, G2, G3, G4, G5, and G6 may be formed to pass through at least one insulating layer. For example, the grooves G1, G2, G3, G4, G5, and G6 may be formed to pass through the fourth insulating layer 207 and the first organic insulating layer 209 (or the first organic pattern layer 209*a*). In other embodiments, the grooves G1, G2, G3, G4, G5, and G6 may be formed to pass through the fourth insulating layer 207, the first organic insulating layer 209 (or the first organic pattern layer 209*a*), the second organic insulating layer 211 (or the second organic pattern layer 211*a*), and the third organic insulating layer 213 (or the third organic pattern layer 213*a*).

The grooves G1, G2, G3, G4, G5, and G6 may each be formed by etching portions of the fourth insulating layer 207 and the first organic insulating layer 209. In such an embodiment, the protective layers 121, 122, 123, 124, 125, and 126 may act as etch stoppers. The lower surfaces of the grooves G1, G2, G3, G4, G5, and G6 may correspond to the upper surfaces of the protective layers 121, 122, 123, 124, 125, and 126, respectively.

Some layers included in the organic light-emitting diode OLED, for example, a first functional layer 222*a* and a second functional layer 222*c*, may be disconnected or separated from each other by the grooves G1, G2, G3, G4, G5, and G6, the dams 510 and 520, and the separators 610, 620, and 630. Also, the opposite electrode 223 may also be disconnected or separated by the structures of the grooves G1, G2, G3, G4, G5, and G6, the dams 510 and 520, and the separators 610, 620, and 630. Also, the capping layer 230 may also be disconnected or separated by the grooves G1, G2, G3, G4, G5, and G6, the dams 510 and 520, and the separators 610, 620, and 630.

As described above, because the dams 510 and 520 and the separators 610, 620, and 630 each include the first organic pattern layer 209*a* and the width of the upper portion of the first organic pattern layer 209*a* is greater than the width of the lower portion of the first organic pattern layer 209*a*, the first functional layer 222*a*, the second functional layer 222*c*, and the opposite electrode 223 may be disconnected or separated by the grooves G1, G2, G3, G4, G5, and G6, the dams 510 and 520, and the separators 610, 620, and 630.

For example, the first functional layer 222*a*, the second functional layer 222*c*, and the opposite electrode 223 may be disconnected or separated from each other by the first groove G1 and the first dam 510. The first functional layer 222*a*, the second functional layer 222*c*, and the opposite electrode 223 may be disconnected or separated from each other by the second groove G2, the first dam 510, and the first separator 610. The first functional layer 222*a*, the second functional layer 222*c*, and the opposite electrode 223 may be disconnected or separated from each other by the third groove G3, the first separator 610, and the second separator 620. The first functional layer 222*a*, the second functional layer 222*c*, and the opposite electrode 223 may be disconnected or separated from each other by the fourth groove G4, the second separator 620, and the third separator 630. The first functional layer 222*a*, the second functional layer 222*c*, and the opposite electrode 223 may be disconnected or separated from each other by the fifth groove G5, the third separator 630, and the second dam 520. The first functional layer 222*a*, the second functional layer 222*c*, and the opposite electrode 223 may be disconnected or separated from each other by the sixth groove G6, the second dam 520, and the crack dam 530.

Moisture may travel toward the display area (see, e.g., DA in FIG. 8) through (or along) the side surface of the opening 10OP in the display panel 10. The continuously formed organic material layers, for example, the first and second functional layers 222*a* and 222*c*, may act as a passage for moisture described above. However, as illustrated in FIG. 9, because the first and second functional layers 222*a* and 222*c* are disconnected from each other by the structures of the grooves G1, G2, G3, G4, G5, and G6, the dams 510 and 520, and the separators 610, 620, and 630, moisture may not travel toward the display area DA.

In an embodiment, the grooves G1, G2, G3, G4, and G5 may be covered with the organic encapsulation layer 320. For example, the first groove G1, the second groove G2, the third groove G3, the fourth groove G4, and the fifth groove G5 may be covered with the organic encapsulation layer 320. For example, the first groove G1, the second groove G2, the third groove G3, the fourth groove G4, and the fifth groove G5 may be filled with the organic encapsulation layer 320.

The first inorganic encapsulation layer 310 of the thin-film encapsulation layer 300 may continuously cover the inner surfaces of the grooves G1, G2, G3, G4, G5, and G6, and the organic encapsulation layer 320 may cover a portion of the middle area MA. The organic encapsulation layer 320 may cover some of the grooves G1, G2, G3, G4, G5, and G6, for example, the first groove G1, the second groove G2, the third groove G3, the fourth groove G4, and the fifth groove G5. The second inorganic encapsulation layer 330 may completely cover the middle area MA.

When the organic encapsulation layer 320 is formed, the flow of monomers may be controlled by the first dam 510 and the second dam 520. In the middle area MA, the organic encapsulation layer 320 may be discontinuous by (e.g., the organic encapsulation layer 320 may be separated or spaced apart from itself by) the first dam 510. An end of the organic encapsulation layer 320 may be located at one side of the first dam 510. Also, the end of the organic encapsulation layer 320 may be located at one side of the second dam 520. The organic encapsulation layer 320 may not extend toward the opening area OA while passing through the second dam 520. A portion of the second inorganic encapsulation layer 330 may be in direct contact with a portion of the first inorganic encapsulation layer 310 on the second dam 520.

Referring to the opening area OA shown in FIG. 9, the display panel 10 has an opening 10OP. The opening 10OP in the display panel 10 may have openings in elements constituting the display panel 10. For example, the opening 10OP in the display panel 10 may be formed of an opening 100OP in the substrate 100 and openings 310OP and 330OP in the first and second inorganic encapsulation layers 310 and 330 of the thin-film encapsulation layer 300.

The cross-sectional view of the display device 1 illustrated in FIG. 9 may be understood as a structure surrounding (e.g., extending around a periphery of) the opening area OA. For example, as illustrated in FIG. 7, the grooves G1, G2, G3, G4, G5, and G6 of FIG. 9 may each have a ring shape surrounding the opening area OA when viewed from a direction perpendicular to the upper surface of the substrate 100 (e.g., when viewed in a plan view). For example, the grooves G1, G2, G3, G4, G5, and G6 may each have a closed loop shape surrounding the opening area OA when viewed from a direction perpendicular to the upper surface of the substrate 100.

Also, the dams 510, 520, and 530 and the crack dam 530 may each have a ring shape surrounding the opening area OA when viewed from a direction perpendicular to the upper surface of the substrate 100. Also, the separators 610, 620, and 630 may each have a ring shape surrounding the opening area OA when viewed from a direction perpendicular to the upper surface of the substrate 100.

FIGS. 10 to 21 are cross-sectional views schematically illustrating steps of a method of manufacturing a display device according to an embodiment. Hereinafter, the method of manufacturing the display device, according to an embodiment, will be described with reference to FIGS. 10 to 21.

The method of manufacturing the display device, according to an embodiment, may include: forming a planarization layer 209*b* on a substrate 100, the substrate 100 having an opening area (see, e.g., OA in FIG. 7), a display area (see, e.g., DA in FIG. 7) at least partially surrounding the opening area OA, and a middle area MA between the opening area OA and the display area DA; forming a second organic pattern layer 211*a* on the planarization layer 209*b*; forming a third organic pattern layer 213*a* on the second organic pattern layer 211*a*; forming a cover layer 214 on the third organic pattern layer 213*a*; forming a first organic pattern layer 209*a* by patterning the planarization layer 209*b*; and removing the cover layer 214.

Figure 10:
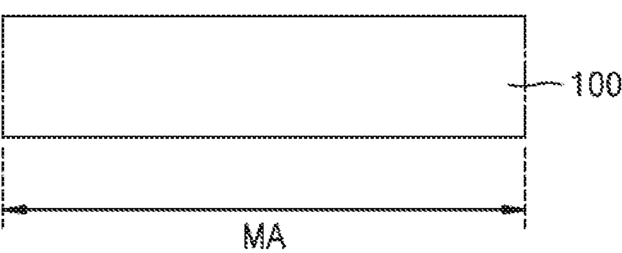
FIGS. 10 to 21 are cross-sectional views illustrating steps of a method of manufacturing the display device according to an embodiment.
Figure 11:
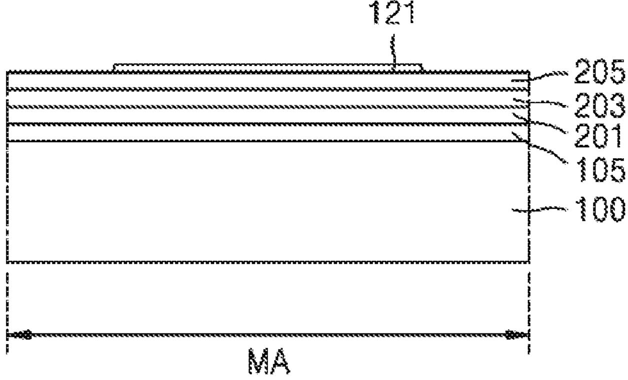

Referring to FIGS. 10 and 11, a buffer layer 105, a first insulating layer 201, a second insulating layer 203, and a third insulating layer 205 may be sequentially formed on the substrate 100. The buffer layer 105, the first insulating layer 201, the second insulating layer 203, and the third insulating layer 205 may each include an inorganic insulating material, such as silicon oxide, silicon nitride, silicon oxynitride, aluminum oxide, titanium oxide, tantalum oxide, and hafnium oxide.

A protective layer 121 may be formed on the third insulating layer 205. The protective layer 121 may include polysilicon. In other embodiments, the protective layer 121 may include amorphous silicon, an oxide semiconductor, or an organic semiconductor.

Figure 12:
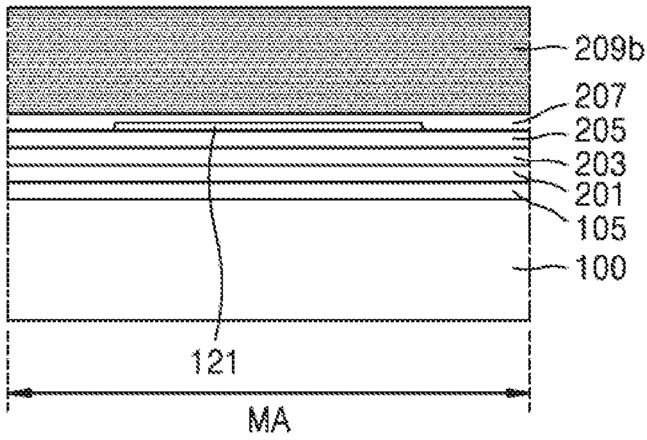

Referring to FIG. 12, a fourth insulating layer 207 and the planarization layer 209*b* may be formed on the protective layer 121. The fourth insulating layer 207 may include an inorganic insulating material, such as silicon oxide, silicon nitride, silicon oxynitride, aluminum oxide, titanium oxide, tantalum oxide, and hafnium oxide. The planarization layer 209*b* may include an organic insulating material selected from general-purpose polymers, such as PMMA or PS, polymer derivatives having a phenolic group, an acrylic polymer, an imide-based polymer, an aryl ether-based polymer, an amide-based polymer, a fluorine-based polymer, a p-xylene-based polymer, a vinyl alcohol-based polymer, and any blend thereof. The planarization layer 209*b* may be disposed on the same layer as the first organic insulating layer (see, e.g., 209 in FIG. 8) and may include the same material as that of the first organic insulating layer (see, e.g., 209 in FIG. 8).

Figure 13:
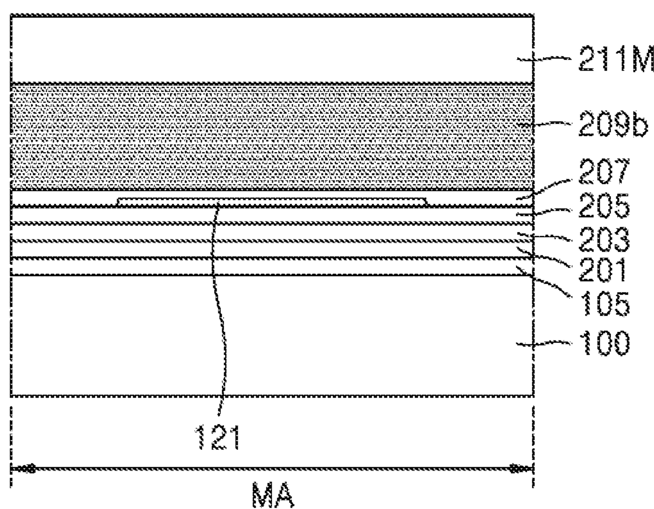
Figure 14:
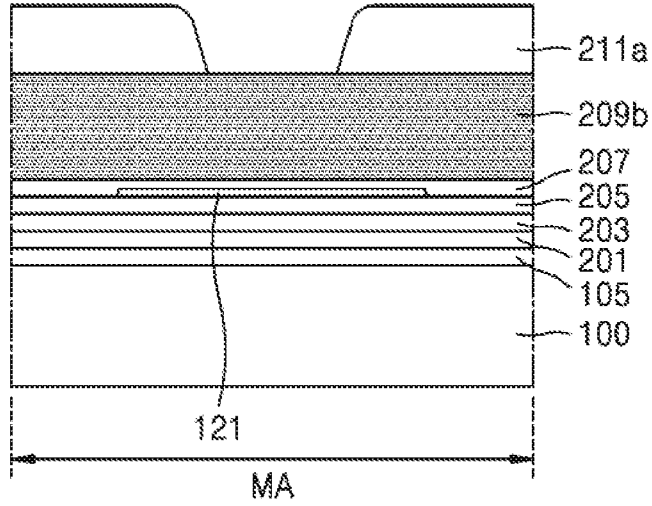

Referring to FIGS. 13 and 14, a second organic pattern layer 211*a* may be formed on the planarization layer 209*b*. The second organic pattern layer 211*a* may be disposed on the same layer as the second organic insulating layer 211 described above with reference FIG. 8 and may include the same material as that of the second organic insulating layer 211.

The forming of the second organic pattern layer 211*a* on the planarization layer 209*b* may include forming a first organic material layer 211M on the planarization layer 209*b* and forming the second organic pattern layer 211*a* by patterning the first organic material layer 211M.

The first organic material layer 211M may include an organic insulating material selected from general-purpose polymers, such as PMMA or PS, polymer derivatives having a phenolic group, an acrylic polymer, an imide-based polymer, an aryl ether-based polymer, an amide-based polymer, a fluorine-based polymer, a p-xylene-based polymer, a vinyl alcohol-based polymer, and any blend thereof.

Figure 15:
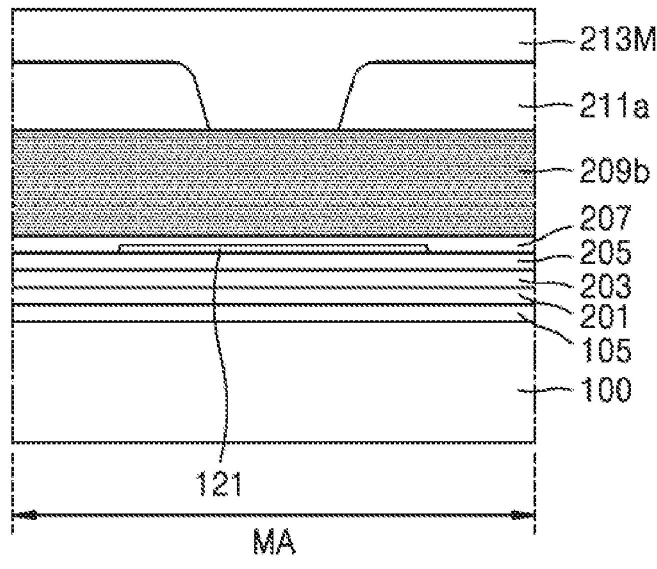
Figure 16:
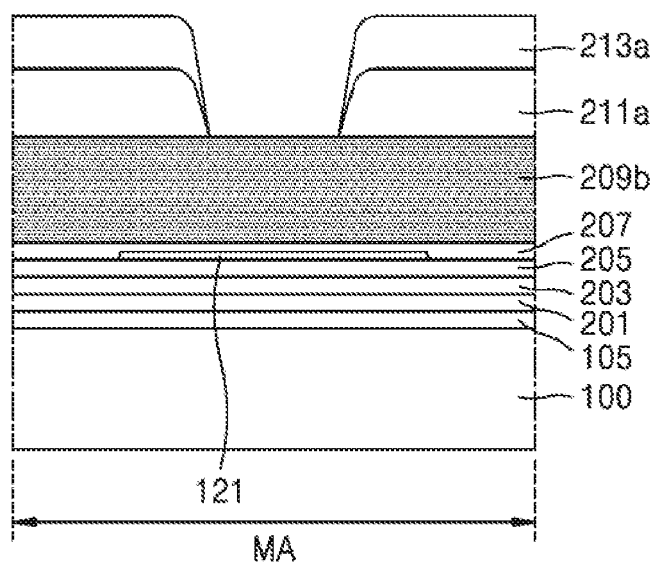

Referring to FIGS. 15 and 16, a third organic pattern layer 213*a* may be formed on the second organic pattern layer 211*a*. The third organic pattern layer 213*a* may be disposed on the same layer as the third organic insulating layer 213 described above with reference FIG. 8 and may include the same material as that of the third organic insulating layer 213.

The forming of the third organic pattern layer 213*a* on the second organic pattern layer 211*a* may include forming a second organic material layer 213M on the second organic pattern layer 211*a* and forming the third organic pattern layer 213*a* by patterning the second organic material layer 213M. The second organic material layer 213M may include an organic insulating material.

In an embodiment, the third organic pattern layer 213*a* may cover the second organic pattern layer 211*a*. For example, the third organic pattern layer 213*a* may completely cover the second organic pattern layer 211*a*.

Figure 17:
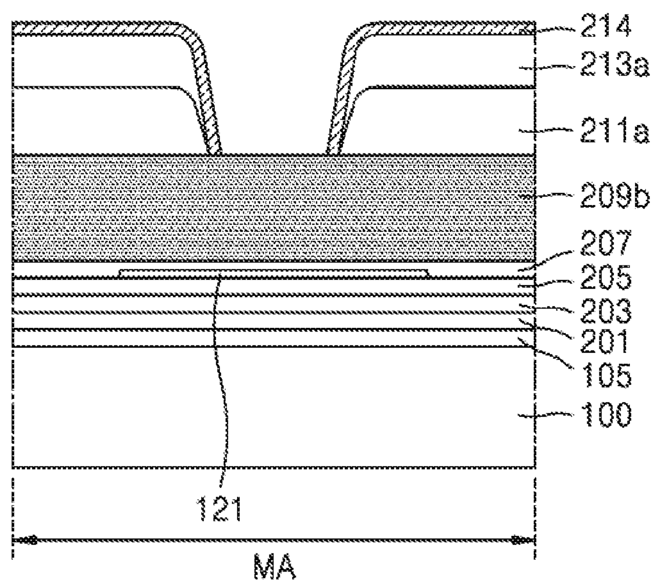

Referring to FIG. 17, a cover layer 214 may be formed on the third organic pattern layer 213*a*. The cover layer 214 may cover the second organic pattern layer 211*a* and/or the third organic pattern layer 213*a*. For example, the cover layer 214 may completely cover the second organic pattern layer 211*a* and/or the third organic pattern layer 213*a*. Accordingly, the second organic pattern layer 211*a* and/or the third organic pattern layer 213*a* may not be exposed to the outside.

In an embodiment, an end of the cover layer 214 may be located on the planarization layer 209*b*. The cover layer 214 may be provided to prevent the second organic pattern layer 211*a* and the third organic pattern layer 213*a* from being etched when the planarization layer 209*b* is patterned. Because the cover layer 214 is on the third organic pattern layer 213*a*, the second organic pattern layer 211*a* and the third organic pattern layer 213*a* may not be etched (or patterned) together when the planarization layer 209*b* is patterned.

In an embodiment, the cover layer 214 may include In—Ga—Zn—O (IGZO), In—Sn—Zn—O (ITZO), or In—Ga—Sn—Zn—O (IGTZO).

Figure 18:
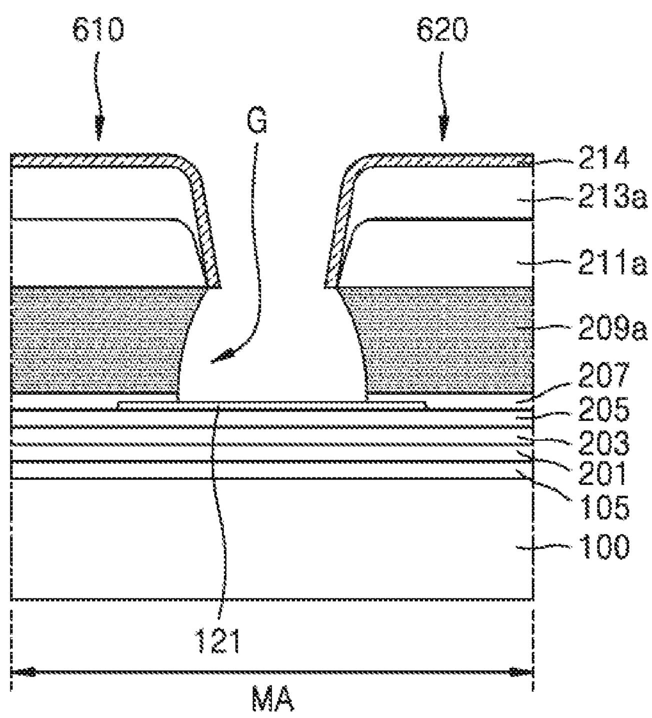

Referring to FIG. 18, a first organic pattern layer 209*a* may be formed by patterning the planarization layer 209*b*. The first organic pattern layer 209*a* may be formed by dry-etching at least a portion of the planarization layer 209*b*. In such an embodiment, the cover layer 214 on the third organic pattern layer 213*a* may act as a mask. Accordingly, when the planarization layer 209*b* is dry-etched, the second organic pattern layer 211*a* and the third organic pattern layer 213*a* disposed below the cover layer 214 may not be etched and the shapes thereof may be maintained.

In an embodiment, the width of the upper portion of the first organic pattern layer 209*a* may be greater than the width of the lower portion of the first organic pattern layer 209*a*. For example, the first organic pattern layer 209*a* may have a narrow lower portion and a wide upper portion. In some embodiments, the first organic pattern layer 209*a* may have a mushroom shape.

Also, the width of the second organic pattern layer 211*a* on the first organic pattern layer 209*a* may be greater than the width of the first organic pattern layer 209*a*. Also, the width of the third organic pattern layer 213*a* on the second organic pattern layer 211*a* may be greater than the width of the second organic pattern layer 211*a*. However, the present disclosure is not limited thereto.

In an embodiment, when the planarization layer 209*b* is dry-etched, at least a portion of the fourth insulating layer 207 may be etched together to expose a portion of the protective layer 121. For example, the protective layer 121 may act as an etch stopper. Accordingly, the etching of the insulating layers and the substrate 100 disposed under the protective layer 121 may be prevented.

In an embodiment, first and second separators 610 and 620 may be formed by patterning the planarization layer 209*b* into the first organic pattern layer 209*a*. The first separator 610 and the second separator 620 may each include the first organic pattern layer 209*a*, the second organic pattern layer 211*a*, and the third organic pattern layer 213*a*.

Also, because the planarization layer 209*b* is patterned into the first organic pattern layer 209*a*, a groove G may be formed between the first separator 610 and the second separator 620. In an embodiment, the groove G may be formed to pass through at least one insulating layer. For example, the groove G may be formed to pass through the fourth insulating layer 207 and the first organic pattern layer 209*a*. In other embodiments, the groove G may be formed to pass through the fourth insulating layer 207, the first organic pattern layer 209*a*, the second organic pattern layer 211*a*, and the third organic pattern layer 213*a*.

Figure 19:
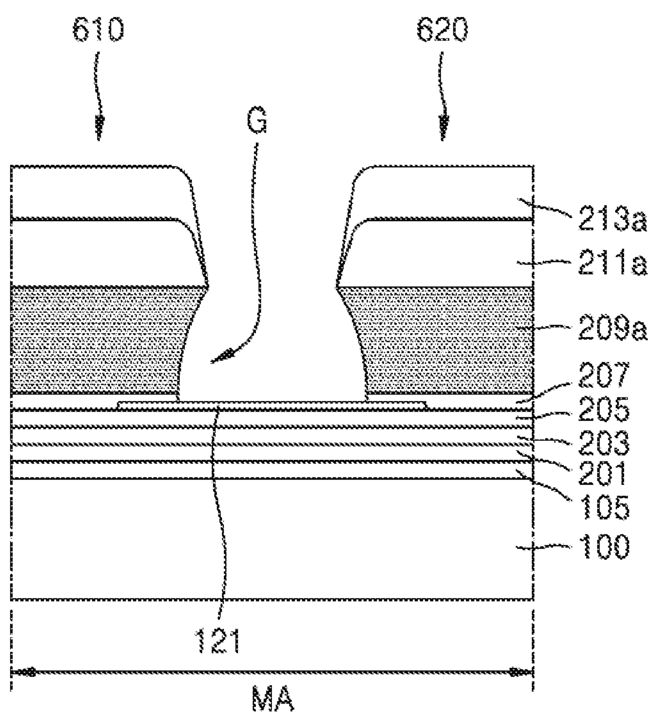

Referring to FIG. 19, the cover layer 214 on the third organic pattern layer 213*a* may be removed. In an embodiment, the cover layer 214 may be removed by wet etching.

Figure 20:
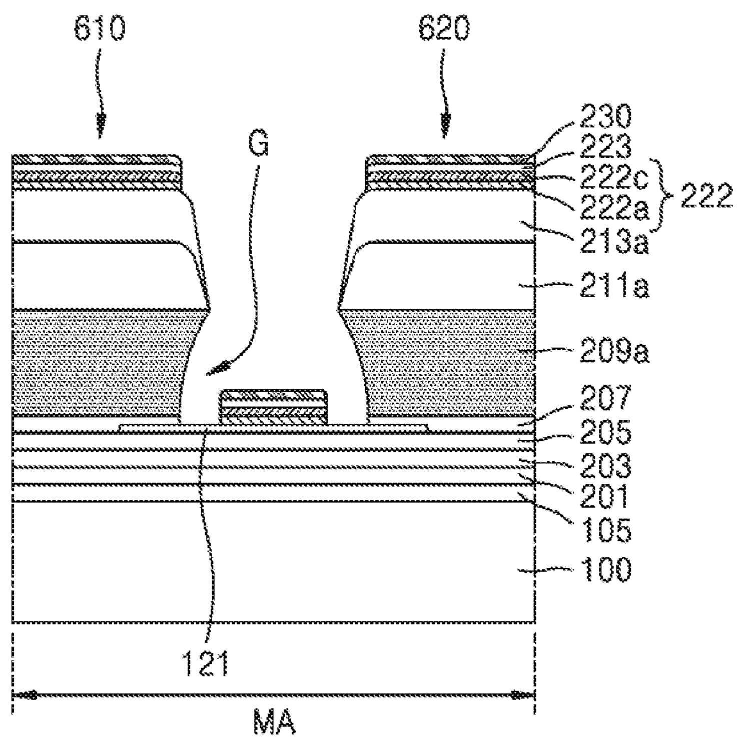

Referring to FIG. 20, an intermediate layer 222 and an opposite electrode 223 may be formed on the third organic pattern layer 213*a*. For example, a first functional layer 222*a*, a second functional layer 222*c*, the opposite electrode 223, and a capping layer 230 may be sequentially formed on the third organic pattern layer 213*a*.

In an embodiment, the first functional layer 222*a*, the second functional layer 222*c*, the opposite electrode 223, and the capping layer 230 may be disconnected or separated from each other by the first separator 610, the second separator 620, and the groove G. In some embodiments, the first organic pattern layer 209*a* of each of the first separator 610 and the second separator 620 has a shape in which the width of the upper portion thereof is greater than the width of the lower portion thereof, and the first functional layer 222*a*, the second functional layer 222*c*, the opposite electrode 223, and the capping layer 230 may be disconnected or separated from each other by the first separator 610, the second separator 620, and the groove G.

Figure 21:
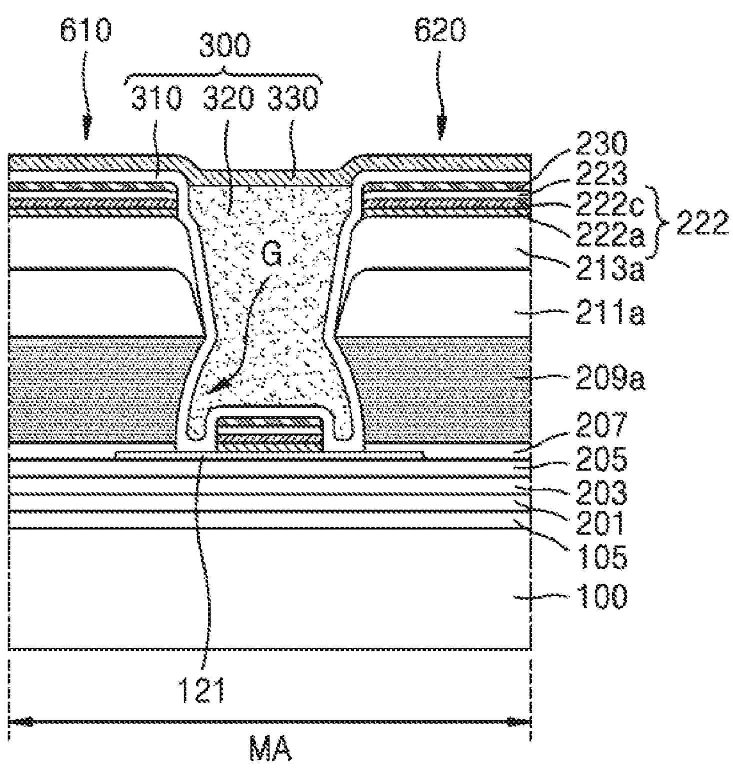

Referring to FIG. 21, a thin-film encapsulation layer 300 may be formed on the opposite electrode 223. The thin-film encapsulation layer 300 may include a first inorganic encapsulation layer 310, an organic encapsulation layer 320, and a second inorganic encapsulation layer 330. The first inorganic encapsulation layer 310 may continuously cover the inner surface of the groove G. The organic encapsulation layer 320 may cover the groove G. For example, the organic encapsulation layer 320 may be formed in the groove G. In some embodiments, the organic encapsulation layer 320 may fill the groove G. The second inorganic encapsulation layer 330 may be formed on the first inorganic encapsulation layer 310 and the organic encapsulation layer 320.

When the first and second separators 610 and 620 are formed by using a metal pattern, a step may occur due to the metal pattern, the metal pattern may be corroded, or cracks may occur in the first inorganic encapsulation layer 310. In the display device according to one or more embodiments, because the first and second separators 610 and 620 are formed by the first organic pattern layer 209*a*, the second organic pattern layer 211*a*, and the third organic pattern layer 213*a* without using a metal pattern, the occurrence of a step may be prevented and the occurrence of cracks in the first inorganic encapsulation layer 310 may be prevented. Also, because the first functional layer 222*a*, the second functional layer 222*c*, the opposite electrode 223, and the capping layer 230 are disconnected or separated from each other through a simpler structure, damage to the organic light-emitting diode OLED due to moisture may be prevented.

The display device according to one or more embodiments may prevent the display elements around the opening area from being damaged due to external impurities, such as moisture.

It should be understood that the embodiments described herein should be considered in a descriptive sense and not for purposes of limitation. Descriptions of features and/or aspects within each embodiment should typically be considered as available for other similar features and/or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display device comprising:

a substrate having an opening area, a display area at least partially extending around the opening area, and a middle area between the opening area and the display area;

a light-emitting element in the display area, the light-emitting element comprising a pixel electrode, an opposite electrode, and a functional layer between the pixel electrode and the opposite electrode;

a first separator in the middle area;

a second separator between the first separator and the opening area;

a first groove between the first separator and the second separator; and a first protective layer between the substrate and the first groove, an inner edge of the first protective layer being covered by the second separator and an outer edge of the first protective layer being covered by the first separator.

2. The display device of claim 1, wherein the first separator comprises a first organic pattern layer, a second organic pattern layer, and a third organic pattern layer sequentially stacked in this order, and wherein a width of an upper portion of the first organic pattern layer is greater than a width of a lower portion of the first organic pattern layer.

3. The display device of claim 2, wherein a width of the second organic pattern layer is greater than a width of the first organic pattern layer.

4. The display device of claim 1, wherein the functional layer extends from the display area to the middle area, and wherein the functional layer is disconnected at the first separator and the second separator.

5. The display device of claim 1, wherein the opposite electrode extends from the display area to the middle area, and wherein the opposite electrode is disconnected at the first separator and the second separator.

6. The display device of claim 1, further comprising:

a first dam between the display area and the first separator;

a second groove between the first dam and the first separator; and a second protective layer between the substrate and the second groove.

7. The display device of claim 6, further comprising:

a third separator between the second separator and the opening area;

a third groove between the second separator and the third separator; and a third protective layer between the substrate and the third groove.

8. The display device of claim 7, further comprising:

a second dam between the third separator and the opening area; and a crack dam between the second dam and the opening area.

* * * * *